United States Patent
Kodama

(10) Patent No.: US 7,192,685 B2
(45) Date of Patent: Mar. 20, 2007

(54) POSITIVE RESIST COMPOSITION AND METHOD OF FORMING RESIST PATTERN USING THE SAME.

(75) Inventor: Kunihiko Kodama, Shizyoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/806,451

(22) Filed: Mar. 23, 2004

(65) Prior Publication Data

US 2004/0197708 A1  Oct. 7, 2004

(30) Foreign Application Priority Data

Mar. 24, 2003 (JP) .......................... P2003-081260

(51) Int. Cl.
*G03F 7/004* (2006.01)

(52) U.S. Cl. .................. 430/270.1; 430/913; 430/914; 430/311

(58) Field of Classification Search ............ 430/270.1, 430/913, 914, 311
See application file for complete search history.

(56) References Cited

U.S. PATENT DOCUMENTS 6,383,715 B1  5/2002  Lu et al.

FOREIGN PATENT DOCUMENTS

| | | |
|---|---|---|
| EP | 0 447 868 A1 | 9/1991 |
| EP | 1 243 968 A2 | 9/2002 |
| EP | 1 376 232 A1 | 1/2004 |
| JP | 2001-66779 A | 3/2001 |
| JP | 2003307850 A * | 10/2003 |
| JP | 2003316005 A * | 11/2003 |
| JP | 2003345022 A * | 12/2003 |
| WO | WO 00/17712 A1 | 3/2000 |

OTHER PUBLICATIONS

European Search Report dated Aug. 17, 2004.

* cited by examiner

*Primary Examiner*—Amanda Walke
(74) *Attorney, Agent, or Firm*—Sughrue Mion, PLLC

(57) ABSTRACT

A positive resist composition comprising: (A) a fluorine atom-containing resin, wherein the resin comprises at least one group that increases a solubility of the resin in an alkali developer by the action of an acid; and (B) a sulfonium salt compound having a cation moiety, wherein the cation moiety contains at least one hydroxy group, and the sulfonium salt compound generates an acid upon irradiation with one of an actinic ray and a radiation.

12 Claims, No Drawings

US 7,192,685 B2

POSITIVE RESIST COMPOSITION AND METHOD OF FORMING RESIST PATTERN USING THE SAME.

BACKGROUND OF THE INVENTION

1. Field of the Invention

The present invention relates to a positive resist composition and a method of forming a resist pattern using the same, the composition being suitable for use in microlithography processes such as the production of ULSIs or high-capacity microchips and in other photofabrication processes. More particularly, the invention relates to a positive resist composition capable of forming a high-resolution pattern with a vacuum ultraviolet light having a wavelength of 160 nm or shorter.

2. Description of the Related Art

The degree of integration in integrated circuits is increasing more and more, and it has become necessary to form an ultrafine pattern having a line width of a quarter micrometer or smaller in the production of semiconductor substrates for ULSIs or the like. One of the known techniques for enhancing the fineness of such patterns is to use an exposure light having a shorter wavelength in resist pattern formation.

For example, in the production of semiconductor elements having an integration degree of up to 64 megabits, the i-line (365 nm) from a high-pressure mercury lamp has hitherto been used as an exposure light. Many compositions comprising a novolak resin and a naphthoquinonediazide compound as a photosensitive substance have been developed as positive resists for use with the exposure light, and have given sufficient results in forming patterns having line widths down to about 0.3 µm. On the other hand, in the production of semiconductor elements having an integration degree of 256 megabits or higher KrF excimer laser light (248 nm) has been used as an exposure light in place of the i-line.

Furthermore, use of ArF excimer laser light (193 nm), which is an exposure light having an even shorter wavelength, and use of $F_2$ excimer laser light (157 nm) for forming a pattern having a line width of 0.1 µm or smaller are recently being investigated for the purpose of producing semiconductor elements having an integration degree of 1 gigabit or higher.

With the use of such exposure lights having shorter wavelengths, the components of resist materials and the structures of compounds for use therein are changing considerably. Since the resists heretofore in use which comprise a novolak resin and a naphthoquinonediazide compound show considerable absorption in a 248 nm far-ultraviolet region, the light is less apt to reach the resist bottom. Namely, such resists have low sensitivity and the patterns obtained therefrom have been limited to ones having a tapered shape.

For eliminating such problem, a so-called chemical amplification type resist has been developed. This resist composition comprises a combination of: a resin, as the main component, having a poly(hydroxystyrene) backbone which shows reduced absorption in a 248 nm region and is protected by acid-decomposable groups; and a compound which generates an acid upon irradiation with far ultraviolet light (photo-acid generator); In the chemical amplification type resist; an acid generates in exposed areas and this acid catalyzes a decomposition reaction to thereby change solubility in a developing solution. Because of this, the resist can have high sensitivity and form a high-resolution pattern.

However, in the case where ArF excimer laser light (193 nm) is used, even the chemical amplification type resist does not show sufficient performances because the compound having aromatic groups intrinsically shows considerable absorption in a 193 nm wavelength region.

An improvement in chemical amplification type resists is being attempted for overcoming the problem described above. This improvement is based on the use of an acid-decomposable resin which has, incorporated in the polymer main chain or side chains thereof, alicyclic structures showing no absorption at 193 nm, in place of the acid-decomposable resin having a poly(hydroxystyrene) backbone.

However, with respect to use with $F_2$ excimer laser light (157 nm), even the alicyclic resin was found to be insufficient in obtaining a desired pattern of 0.1 µm or finer because the resin shows considerable absorption in a 157 nm region. Under these circumstances, a resin having fluorine atoms (perfluorinated structure) incorporated therein was reported to have sufficient transparency at 157 nm, in, e.g., *Proceedings of the Society of Photo-Optical Instrumentation Engineers* (*Proc. SPIE*), Vol. 3678, p. 13 (1999). Effective structures of such fluororesins are proposed in *Proceedings of the Society of Photo-Optical Instrumentation Engineers* (*Proc. SPIE*), Vol. 3999, p. 330 (2000), *Proceedings of the Society of Photo-Optical Instrumentation Engineers* (*Proc. SPIE*), Vol. 3999, p. 357 (2000), *Proceedings of the Society of Photo-Optical Instrumentation Engineers* (*Proc. SPIE*), Vol. 3999, p. 365 (2000), and WO-00/17712.

The resists containing such fluororesins, however, have peculiar water and oil repellency attributable to the perfluorinated structure. There has hence been a desire for an improvement in applicability (coating surface evenness) and diminution of development defects.

JP-A-2001-66779 discloses a resist composition containing a phenolic resin. In this technique, an improvement in the diminution of development defects and line edge roughness is attempted by incorporating a sulfonium salt having a hydroxy group.

Furthermore, there has been the following problem. Since triphenylsulfonium triflate and triphenylsulfonium nonafluorobutanesulfonate, which have hitherto been used as acid generators, do not dissolve in developing solutions, use thereof in combination with a water-repellent fluororesin makes the resist surface poorly soluble and this tends to result in reduced sensitivity and development defects.

SUMMARY OF THE INVENTION

Accordingly, an object of the invention is to provide a positive resist composition and a method of forming a resist pattern using the same, the composition being suitable for use with an exposure light having a wavelength of 160 nm or shorter, in particular, $F_2$ excimer laser light (157 nm). Specifically, the object is to provide a positive resist composition which is sufficiently transparent to the exposure light having a wavelength of 157 nm and which, even when a water-repellent fluororesin is contained therein, shows satisfactory sensitivity and is less apt to cause development defects.

The present inventors made intensive investigations in view of the properties described above. As a result, they have found that the object of the invention is successfully accomplished by using the following specific compositions. The invention has been thus achieved.

The invention has the following constitutions.

(1) A positive resist composition comprising: (A) a fluorine atom-containing resin, wherein the resin comprises at least one group that increases a solubility of the resin in an alkali developer by the action of an acid; and (B) a sulfonium salt compound having a cation moiety, wherein the cation moiety contains at least one hydroxy group, and the sulfonium salt compound generates an acid upon irradiation with one of an actinic ray and a radiation.

(2) The positive resist composition of claim 1, wherein the resin (A) is a resin which has repeating a unit having a group represented by the following general formula (Z):

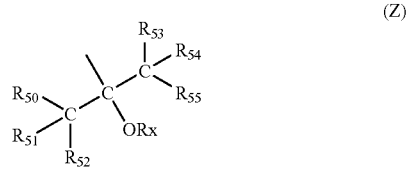

wherein $R_{50}$ to $R_{55}$ each independently represents a hydrogen atom, a fluorine atom, or an alkyl group, provided that at least one of $R_{50}$ to $R_{55}$ represents either a fluorine atom or an alkyl group in which at least one of the hydrogen atoms has been replaced by a fluorine atom; and Rx represents a hydrogen atom or an organic group.

(3) The positive resist composition as described in (1) or (2) above, wherein the resin (A) includes a repeating unit and the repeating unit includes a group where a carboxyl group is protected by an acid-decomposable group.

(4) The positive resist composition as described in any one of (1) to (3) above, wherein the resin (A) has a weight-average molecular weight of from 1,000 to 200,000, and the resin (A) has no more than 10% by weight of a total amount of a component having a molecular weight of 1,000 or lower.

(5) The positive resist composition as described in any one of (1) to (4) above, wherein the sulfonium salt compound as ingredient (B) is represented by the following general formula (A):

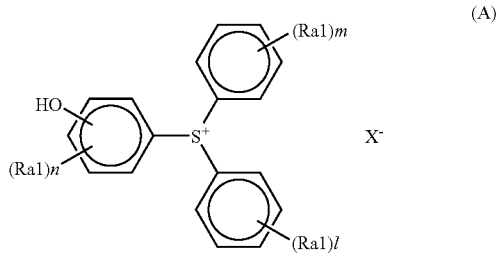

wherein $Ra_1$ represents a hydroxy group, a halogen atom, an alkyl group, an alkoxy group, an alkoxycarbonyl group, an aryl group, an aryloxy group, an acyl group, an acylamino group, or an alkylsulfonylamino group, provided that when two or more $Ra_1$'s are present in the molecule, these are the same or different; l, m, and n each represents an integer of 0 to 4; and $X^-$ represents a non-nucleophilic anion.

(6) The positive resist composition as described in any one of (1) to (5) above, further comprising: (C) a fluorochemical surfactant or silicone surfactant; and (D) a basic compound.

(7) The positive resist composition as described in (6) above, wherein the basic compound (D) is a compound having a structure selected from an imidazole structure, diazabicyclo structure, onium hydroxide structure, onium carboxylate structure, trialkylamine structure, and aniline structure.

(8) The positive resist composition as described in any one of (1) to (7) above, further comprising (F) a dissolution-inhibiting compound having a molecular weight of not more than 3,000 which is capable of decomposing by the action of an acid to increase solubility in an alkali developer.

(9) The positive resist composition as described in any one of (1) to (8) above, wherein the at least one group, that increases a solubility of the resin in an alkali developer by the action of an acid, is a group causing an alkali-soluble group by the action of an acid.

(10) A method of forming a resist pattern comprising: coating the positive resist composition as described in any one of (1) to (9) above on a substrate; irradiating a resultant coating with actinic rays or a radiation; and developing the resultant coating.

DETAILED DESCRIPTION OF THE INVENTION

The invention will be explained below in detail.

[1] (A) Fluorine atom-containing resin having a fluorine atom in at least one of a main chain and a side chain of a polymer framework of the resin, the resin increasing the solubility in an alkali developer by the action of acid (hereinafter referred to also as "fluorine atom-containing resin")

The chemical amplification type resist composition of the invention contains (A) a fluorine atom-containing resin which has a polymer framework wherein the main chain and/or side chains have been substituted with a fluorine atom and which decomposes by the action of an acid to come to have enhanced solubility in an alkali developer (hereinafter referred to also as "ingredient (A)" or "resin (A)"). For example, a fluorine atom-containing resin, which has a polymer framework wherein the main chain have been substituted with a fluorine atom, means a polymer having a fluorine atom bonded directly to an atom which constitute the main chain.

The fluorine atom-containing resin which has a polymer framework wherein the main chain and/or side chains have been substituted with fluorine atoms and which decomposes by the action of an acid to come to have enhanced solubility in an alkali developer preferably has repeating units having a group represented by general formula (Z).

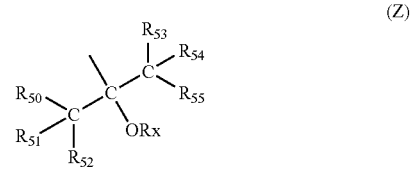

In general formula (Z), $R_{50}$ to $R_{55}$ each independently represent a hydrogen atom, a fluorine atom, or an alkyl group, provided that at least one of $R_{50}$ to $R_{55}$ represents either a fluorine atom or an alkyl group in which at least one of the hydrogen atoms has been replaced by a fluorine atom. Rx represents a hydrogen atom or an organic group (preferably, an acid-decomposable group, alkyl group, cycloalkyl group, acyl group, or alkoxycarbonyl group).

Preferred examples of the alkyl groups represented by $R_{50}$ to $R_{55}$ include alkyl groups which have 1 to 3 carbon atoms and may have been substituted with, e.g., a halogen atom such as a fluorine atom, cyano, etc. Specific examples thereof include methyl and trifluoromethyl. Preferably, $R_{50}$ to $R_{55}$ each are a fluorine atom.

The organic group represented by Rx preferably is an acid-decomposable group or an alkyl, cycloalkyl, acyl, alkylcarbonyl, alkoxycarbonyl, alkoxycarbonymethyl, alkoxymethyl, or 1-alkoxyethyl group which may have one or more substituents.

Examples of the acid-decomposable group (group which dissociates by the action of an acid to become alkali-soluble) include —O—C ($R_{18}d$)($R_{18}e$)($R_{18}f$), —O—C ($R_{18}d$)($R_{18}e$)(OR$_{18}g$), —O—COO—C($R_{18}d$)($R_{18}e$)($R_{18}f$), —O—C($R_{01}$)($R_{02}$)COO—C($R_{18}d$)($R_{18}e$)($R_{18}f$), —COO—C($R_{18}d$)($R_{18}e$)($R_{18}f$), and —COO—C($R_{18}d$)($R_{18}e$)(OR$_{18}g$). $R_{18}d$ to $R_{18}g$ each represent an alkyl, cycloalkyl, alkenyl, aralkyl, or aryl group which may have one or more substituents. $R_{01}$ and $R_{02}$ each represent a hydrogen atom or an alkyl, cycloalkyl, alkenyl, aralkyl, or aryl group which may have one or more substituents. Two of $R_{18}d$ to $R_{18}g$ may be bonded to each other to form a ring.

Preferred examples of the alkyl groups represented by $R_{18}d$ to $R_{18}g$, $R_{01}$, and $R_{02}$ include alkyl groups having 1 to 5 carbon atoms (e.g., methyl, ethyl, propyl, n-butyl, sec-butyl, and t-butyl).

Preferred examples of the cycloalkyl groups represented by $R_{18}d$ to $R_{18}g$, $R_{01}$, and $R_{02}$ include cycloalkyl groups having 3 to 10 carbon atoms (e.g., cyclopropyl, cyclobutyl, cyclohexyl, and adamantyl).

Preferred examples of the alkenyl groups represented by $R_{18}d$ to $R_{18}g$, $R_{01}$, and $R_{02}$ include alkenyl groups having 2 to 4 carbon atoms (e.g., vinyl, propenyl, and allyl).

Preferred examples of the aryl groups represented by $R_{18}d$ to $R_{18}g$, $R_{01}$, and $R_{02}$ include aryl groups having 6 to 14 carbon atoms (e.g., phenyl, xylyl, tolyl, cumenyl, naphthyl, and anthryl).

Preferred examples of the aralkyl groups represented by $R_{18}d$ to $R_{18}g$, $R_{01}$, and $R_{02}$ include aralkyl groups having 2 to 12 carbon atoms (e.g., benzyl, phenethyl, and cumyl).

Examples of the alkyl group as an example of the organic group represented by Rx and of the alkyl group in the alkylcarbonyl group as another example of the organic group include linear and branched alkyl groups, for example, having 1 to 8 carbon atoms. Preferred examples thereof include methyl, ethyl, propyl, n-butyl, sec-butyl, hexyl, 2-ethylhexyl, and octyl.

The cycloalkyl group as an example of the organic group represented by Rx may be monocyclic or polycyclic. The monocyclic group preferably is one having 3 to 8 carbon atoms, and examples thereof include cyclopropyl, cyclopentyl, cyclohexyl, cycloheptyl, and cyclooctyl. The polycyclic group preferably is one having 6 to 20 carbon atoms, and examples thereof include adamantyl, norbornyl, isobornyl, camphanyl, dicyclopentyl, α-pinel, tricyclodecanyl, tetracyclododecyl, and androstanyl. The cycloalkyl group includes one in which part of the ring-constituting carbon atoms have been replaced by one or more heteroatoms selected from, e.g., oxygen, sulfur, and nitrogen atoms.

Preferred examples of the acyl group as an example of the organic group represented by Rx include acyl groups having 1 to 10 carbon atoms. Specific examples thereof include formyl, acetyl, propanoyl, butanoyl, pivaloyl, octanoyl, and benzoyl.

Preferred examples of the alkoxy group in each of the alkoxycarbonyl group, alkoxycarbonylmethyl group, alkoxymethyl group, and 1-alkoxyethyl group as examples of the organic group represented by Rx include alkoxy groups having 1 to 8 carbon atoms. Specific examples thereof include methoxy, ethoxy, n-propoxy, isopropoxy, butoxy, pentoxy, allyloxy, and octoxy.

Examples of the substituents which may be possessed by the alkyl and other groups as examples of the organic group represented by Rx include ones having active hydrogen, such as amino, amide, hydroxy, and carboxyl, and further include halogen atoms (fluorine, chlorine, bromine, and iodine), alkoxy groups (e.g., methoxy, ethoxy, propoxy, and butoxy), thioether groups, acyl groups (e.g., acetyl, propanoyl, and benzoyl), acyloxy groups (e.g., acetoxy, propanoyloxy, and benzoyloxy), alkoxycarbonyl groups (e.g., methoxycarbonyl, ethoxycarbonyl, and propoxycarbonyl), alkyl groups (e.g., methyl, ethyl, propyl, and butyl), cycloalkyl groups (e.g., cyclohexyl), aryl groups (e.g., phenyl), cyano, and nitro.

The fluorine atom-containing resin (A) preferably has repeating units represented by at least one of the following general formulae (FI) to (FXII). More preferably, the resin (A) is constituted of repeating units represented by at least one of general formulae (FI) to (FXII). Especially preferably, the resin (A) is constituted of repeating units represented by at least one of general formulae (FI) to (FXII) and at least one kind of repeating units among these have a group represented by general formula (Z).

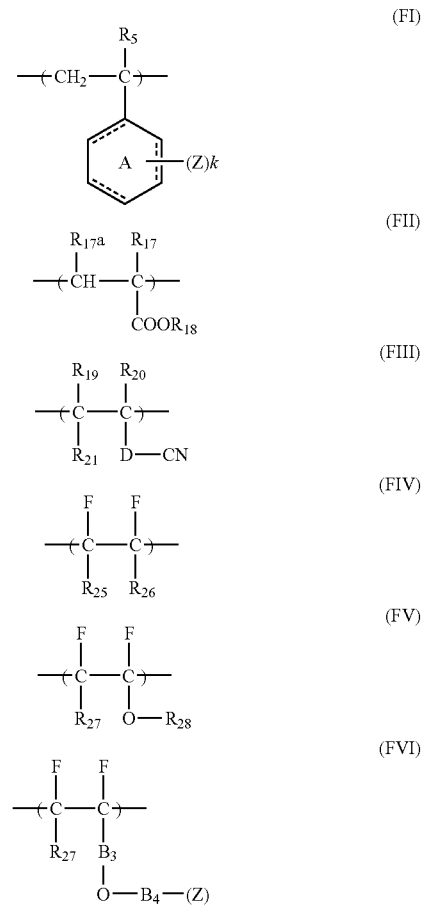

-continued

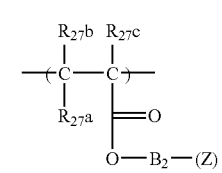
(FVII)

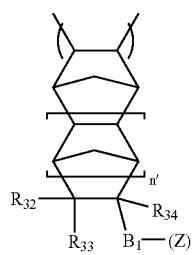
(FVIII)

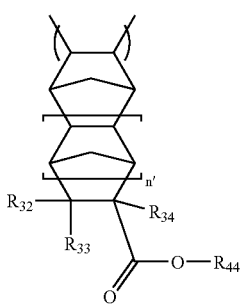
(FIX)

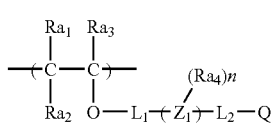
(FX)

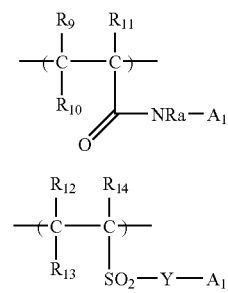
(FXI)

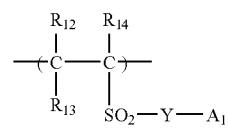
(FXII)

In general formula (FI), $R_5$ represents a hydrogen atom, a halogen atom, a cyano group, or an alkyl group which may have one or more substituents. Ring A represents a phenyl group or a cyclohexyl group. Z represents a group represented by general formula (Z). Symbol k represents an integer of 1 to 5.

In general formula (FI), preferred examples of the alkyl group represented by $R_5$ include alkyl groups which have 1 to 3 carbon atoms and may have been substituted with, e.g., a halogen atom such as a fluorine atom, cyano, etc. Specific examples thereof include methyl and trifluoromethyl.

Examples of the halogen atom represented by $R_5$ include fluorine, chlorine, bromine, and iodine atoms.

In general formula (FII), $R_{17}$ and $R_{17a}$ each independently represent a hydrogen atom, a halogen atom, a cyano group, or an alkyl group which may have one or more substituents.

$R_{18}$ represents a hydrogen atom or an alkyl, cycloalkyl, aralkyl, or aryl group which may have one or more substituents.

In general formula (FII), examples of $R_{17}$ and $R_{17a}$ are the same as the examples of $R_5$ in general formula (FI).

Preferred examples of the alkyl group represented by $R_{18}$ include alkyl groups having 1 to 5 carbon atoms (e.g., methyl, ethyl, propyl, n-butyl, sec-butyl, and t-butyl).

Preferred examples of the cycloalkyl group represented by $R_{18}$ include cycloalkyl groups having 3 to 10 carbon atoms (e.g., cyclopropyl, cyclobutyl, cyclohexyl, and adamantyl).

Preferred examples of the aryl group represented by $R_{18}$ include aryl groups having 6 to 14 carbon atoms (e.g., phenyl, xylyl, tolyl, cumenyl, naphthyl, and anthryl).

Preferred examples of the aralkyl group represented by $R_{18}$ include aralkyl groups having 2 to 12 carbon atoms (e.g., benzyl, phenethyl and cumyl).

In formula (FIII), $R_{19}$ and $R_{20}$ each independently represent a hydrogen atom, a halogen atom, a cyano group, or an alkyl group which may have one or more substituents.

$R_{21}$ represents a hydrogen atom, a halogen atom, a cyano group, an alkyl group which may have one or more substituents, or a —D—CN group.

D represents a single bond or a bivalent connecting group.

In general formula (FIII), examples of $R_{19}$ and $R_{20}$ are the same as the examples of $R_5$ in general formula (FI).

Examples of the halogen atom represented by $R_{21}$ include fluorine, chlorine, bromine, and iodine atoms.

Preferred examples of the alkyl group represented by $R_{21}$ include alkyl groups having 1 to 5 carbon atoms (e.g., methyl, ethyl, propyl, n-butyl, sec-butyl, and t-butyl).

Examples of the bivalent connecting group represented by D include oxy, a carbonyl group, alkylene, cycloalkylene, alkenylene, and arylene groups which may have one or more substituents, and a bivalent connecting group consisting of two or more thereof bonded together. Examples of the alkylene group include methylene, ethylene, propylene, butylene, hexylene, and octylene. Examples of the cycloalkylene group include cyclopentylene and cyclohexylene. Examples of the alkenylene group include ethenylene, propenylene, and butenylene. Examples of the arylene group include phenylene, tolylene, and naphthylene.

In general formulae (FIV) to (FIX), $R_{25}$, $R_{26}$, $R_{27}$, $R_{27}a$, $R_{27}b$, and $R_{27}c$ each independently represent a hydrogen atom, a fluorine atom, or an alkyl, cycloalkyl, or aryl group which may have one or more substituents.

$R_{28}$ represents an alkyl, cycloalkyl, or aryl group which may have one or more substituents.

$R_{25}$ and $R_{26}$ may be bonded to each other to form a ring, and $R_{27}$ and $R_{28}$ may be bonded to each other to form a ring.

$R_{44}$ each represent a hydrogen atom or an alkyl, cycloalkyl, acyl, or alkoxycarbonyl group which may have one or more substituents.

$R_{32}$, $R_{33}$, and $R_{34}$ each independently represent a hydrogen atom, a halogen atom, or an alkyl or alkoxy group which may have one or more substituents.

$B_1$, $B_2$, $B_3$, and $B_4$ each independently represent a single bond or a bivalent connecting group.

Symbol n' represents 0 or 1.

In general formulae (FIV) to (FIX), examples of the halogen atoms represented by $R_{32}$, $R_{33}$, and $R_{34}$ include fluorine, chlorine, bromine, and iodine atoms.

Preferred examples of the alkyl groups represented by $R_{25}$ to $R_{28}$ (which include $R_{27}a$, $R_{27}b$, and $R_{27}c$; the same applies hereinafter), $R_{32}$, $R_{33}$, $R_{34}$, and $R_{44}$ include alkyl groups having 1 to 5 carbon atoms (e.g., methyl, ethyl, propyl, n-butyl, sec-butyl, and t-butyl).

Preferred examples of the cycloalkyl groups represented by $R_{25}$ to $R_{28}$, and $R_{44}$ include cycloalkyl groups having 3 to 10 carbon atoms (e.g., cyclopropyl, cyclobutyl, cyclohexyl, and adamantyl).

Preferred examples of the alkoxy groups represented by $R_{32}$, $R_{33}$, $R_{34}$, and $R_{44}$ and of the alkoxy groups in the alkoxycarbonyl groups represented by these include alkoxy groups having 1 to 5 carbon atoms (e.g., methoxy, ethoxy, propoxy, and n-butoxy).

Preferred examples of the acyl groups represented by $R_{44}$ include acyl groups having 1 to 12 carbon atoms (e.g., aralkyloxy groups, formyl, and acetyl).

Preferred examples of the aryl groups represented by $R_{25}$ to $R_{28}$ include aryl groups having 6 to 14 carbon atoms (e.g., phenyl, xylyl, tolyl, cumenyl, naphthyl, and anthryl).

Examples of the bivalent connecting groups represented by $B_1$, $B_2$, $B_3$, and $B_4$ include oxy, a carbonyl group, alkylene, cycloalkylene, alkenylene, and arylene groups which may have one or more substituents, and a bivalent connecting group consisting of two or more thereof bonded together. Examples of the alkylene group include methylene, ethylene, propylene, butylene, hexylene, and octylene. Examples of the cycloalkylene group include cyclopentylene and cyclohexylene. Examples of the alkenylene group include ethenylene, propenylene, and butenylene. Examples of the arylene group include phenylene, tolylene, and naphthylene.

In general formula (FX), $Ra_1$ to $Ra_3$ each independently represent a hydrogen atom, halogen atom, cyano group, or alkyl group.

$Ra_4$ represents a hydrogen atom, halogen atom, hydroxy group, cyano group, alkyl group, aryl group, alkoxy group, or aralkyl group.

Symbol n represents an integer of 1 to 5. When n is 2 or larger, the $Ra_4$'s may be the same or different.

($Z_1$) represents an alicyclic hydrocarbon group.

Q represents a hydroxy group or an acid-decomposable group.

$L_1$ and $L_2$ each independently represent a single bond or a bivalent connecting group.

In general formula (FX), examples of the halogen atoms represented by $Ra_1$ to $Ra_3$ and $Ra_4$ include fluorine, chlorine, bromine, and iodine atoms.

The alkyl groups represented by $Ra_1$ to $Ra_3$ and $Ra_4$ and the alkyl group in the alkoxy group represented by $Ra_4$ preferably are alkyl groups having 1 to 5 carbon atoms. Examples thereof include methyl, ethyl, and propyl.

The aryl group represented by $Ra_4$ preferably is an aryl group having 6 to 10 carbon atoms. Examples thereof include phenyl, tolyl, and naphthyl.

The aralkyl group represented by $Ra_4$ preferably is an aralkyl group having 7 to 12 carbon atoms. Examples thereof include benzyl, phenethyl, naphthylmethyl, and naphthylethyl.

The alkyl, alkoxy, aryl, aralkyl, and other groups represented by $Ra_1$ to $Ra_3$ and $Ra_4$ may have no substituents or have one or more substituents.

Examples of the substituents which may be possessed by the alkyl, alkoxy, aryl, aralkyl, and other groups represented by $Ra_1$ to $Ra_3$ and $Ra_4$ include halogen atoms, e.g., fluorine atom, hydroxy, alkoxy groups (preferably having 1 to 3 carbon atoms), and cyano.

$Ra_4$ preferably is a hydrogen atom, fluorine atom, trifluoromethyl, hydroxy, cyano, methyl, or ethyl.

Examples of the alicyclic hydrocarbon group represented by ($Z_1$) include ones generally having 7 to 30 carbon atoms, preferably having 7 to 20 carbon atoms, more preferably having 7 to 15 carbon atoms. The alicyclic hydrocarbon group may be monocyclic or polycyclic. Examples thereof include a cycloheptane residue, cyclooctane residue, norbornane residue, adamantane residue, tricyclodecane residue, and tetracyclododecane residue. Preferred examples thereof include a norbornane residue, adamantane residue, tricyclodecane residue, and tetracyclododecane residue.

Examples of the acid-decomposable group represented by Q include the acid-decomposable groups which will be shown later.

Examples of the bivalent connecting groups represented by $L_1$ and $L_2$ include alkylene groups, cycloalkylene groups, alkenylene groups, arylene groups, —O—$R_{22}$a-, —O—CO—$R_{22}$b-, —CO—O—$R_{22}$c-, and —CO—N($R_{22}$d)—$R_{22}$e-; these groups may have one or more substituents. $R_{22}$a, $R_{22}$b, $R_{22}$c, and $R_{22}$e each represent either a single bond or a bivalent alkylene, cycloalkylene, alkenylene, or arylene group which may have an ether, ester, amide, urethane, or ureido group. $R_{22}$d represents a hydrogen atom or an alkyl, cycloalkyl, aralkyl, or aryl group which may have one or more substituents.

Examples of the alkylene group include linear and branched alkylene groups having 1 to 8 carbon atoms, such as methylene, ethylene, propylene, butylene, hexylene, and octylene.

Examples of the cycloalkylene group include monocyclic residues such as cyclopentylene and cyclohexylene and polycyclic residues such as a norbornane framework and adamantane framework (these monocyclic and polycyclic residues each have 5 to 12 carbon atoms).

Preferred examples of the alkenylene group include ones which have 2 to 6 carbon atoms and may have one or more substituents. Specific examples thereof include ethenylene, propenylene, and butenylene.

Preferred examples of the arylene group include ones which have 6 to 15 carbon atoms and may have one or more substituents. Specific examples thereof include phenylene, tolylene, and naphthylene.

Examples of the substituents which may be possessed by the bivalent connecting groups represented by $L_1$ and $L_2$ include halogen atoms, such as fluorine and chlorine atoms, and cyano. The substituents preferably are fluorine atoms.

In general formula (FXI), $R_9$ to $R_{11}$ each independently represent a hydrogen atom, a fluorine atom, a chlorine atom, a cyano group, or an alkyl group in which at least one of the hydrogen atoms has been replaced by a fluorine atom, provided that at least one of $R_9$ to $R_{11}$ is not a hydrogen atom.

Ra represents a hydrogen atom, alkyl group, cycloalkyl group, aryl group, or aralkyl group.

$A_1$ represents a hydrogen atom, a hydroxyl group, a cyano group, alkyl group, cycloalkyl group, aryl group, or aralkyl group.

In general formula (FXII), $R_{12}$ to $R_{14}$ each independently represent a hydrogen atom, a fluorine atom, a chlorine atom, a cyano group, or an alkyl group in which at least one of the hydrogen atoms has been replaced by a fluorine atom.

Y represents a single bond, —O—, or —N(Ra)—. Ra represents a hydrogen atom, alkyl group, cycloalkyl group, aryl group, or aralkyl group.

$A_1$ represents a hydrogen atom, a hydroxyl group, alkyl group, cycloalkyl group, aryl group, or aralkyl group.

In general formulae (FXI) and (FXII), the alkyl groups in which at least one of the hydrogen atoms has been replaced by a fluorine atom, which are represented by $R_9$ to $R_{11}$ and $R_{12}$ to $R_{14}$, each preferably are a linear alkyl group which has 1 to 3 carbon atoms and in which at least one of the hydrogen atoms has been replaced by a fluorine atom. Examples thereof include perfluoromethyl, difluoromethyl, and fluoromethyl.

The alkyl groups represented by Ra and $A_1$ each preferably are an alkyl group having 1 to 8 carbon atoms. Examples thereof include methyl, ethyl, propyl, n-butyl, sec-butyl, hexyl, 2-ethylhexyl, and octyl.

The cycloalkyl groups represented by Ra and $A_1$ may be monocyclic or polycyclic. The monocyclic groups preferably are cycloalkyl groups having 3 to 8 carbon atoms, and examples thereof include cyclopropyl, cyclopentyl, cyclohexyl, cyclobutyl, and cyclooctyl. The polycyclic groups preferably are cycloalkyl groups having 6 to 20 carbon atoms, and examples thereof include adamantyl, norbornyl, isobornyl, camphanyl, dicyclopentyl, α-pinel, tricyclodecanyl, tetracyclododecyl, and androstanyl. In the cycloalkyl groups, part of the carbon atoms may have been replaced by a heteroatom, e.g., oxygen atom.

The aryl groups represented by Ra and $A_1$ each preferably are an aryl group having 6 to 10 carbon atoms. Examples thereof include phenyl, tolyl, dimethylphenyl, 2,4,6-trimethylphenyl, naphthyl, anthryl, and 9,10-dimethoxyanthryl.

The aralkyl groups represented by Ra and $A_1$ each preferably are an aralkyl group having 7 to 12 carbon atoms. Examples thereof include benzyl, phenethyl, and naphthylmethyl.

The alkyl, cycloalkyl, aryl, and aralkyl groups represented by Ra and $A_1$ may have one or more substituents. Examples of the substituents which may be possessed by the alkyl, cycloalkyl, aryl, or aralkyl groups represented by Ra and $A_1$ include alkyl groups, cycloalkyl groups, aryl groups, amino, amide, ureido, urethane, hydroxy, carboxy, halogen atoms, alkoxy groups, thioether groups, acyl groups, acyloxy groups, alkoxycarbonyl groups, cyano, and nitro.

Since the fluorine atom-containing resin (A) has an acid-decomposable group (group which dissociates by the action of an acid to become alkali-soluble; Examples of the alkali-soluble group include a hydroxyl group, a carboxyl acid group and a sulfonic acid group) in at least one kind of repeating units, it decomposes by the action of an acid and comes to have enhanced solubility in an alkali developer.

Examples of the repeating units represented by general formula (FI) are shown below, but the repeating units in the invention should not be construed as being limited to the following examples.

(FI-1)

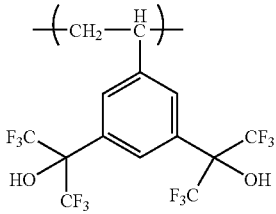

(FI-2)

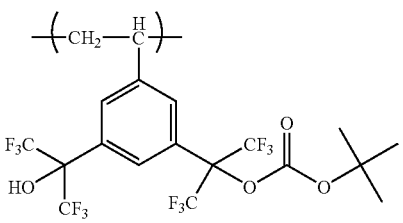

-continued (FI-3)

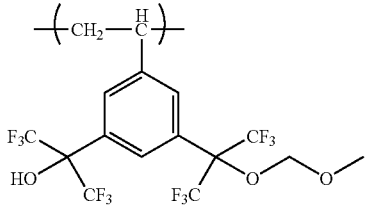

(FI-4)

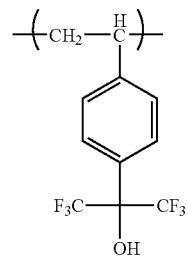

(FI-5)

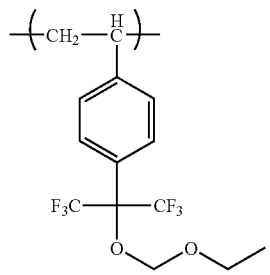

(FI-6)

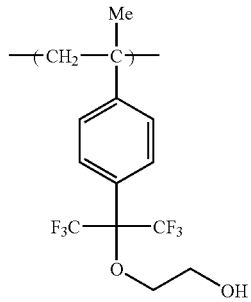

(FI-7)

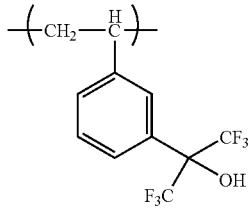

(FI-8)

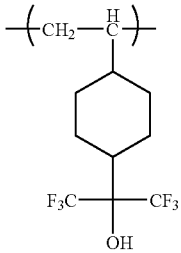

-continued
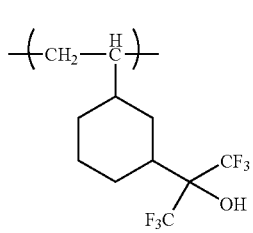
(FI-9)
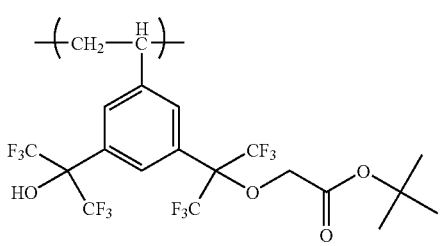
(FI-10)
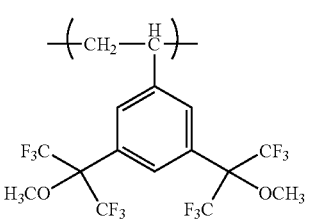
(FI-11)
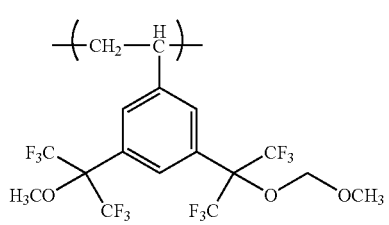
(FI-12)
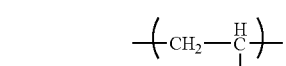
(FI-13)
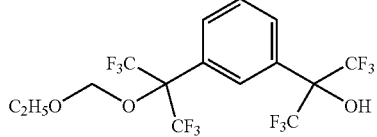
(FI-14)
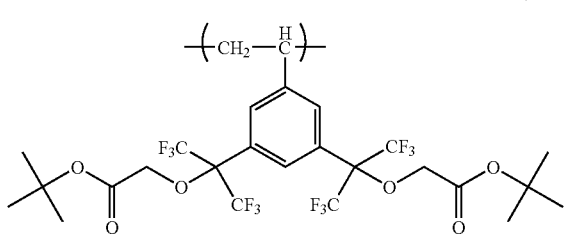
(FI-15)
-continued
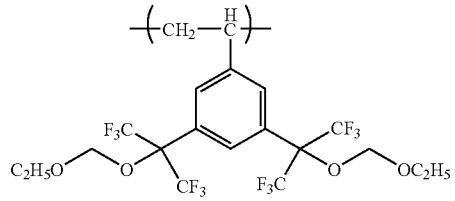
(FI-16)
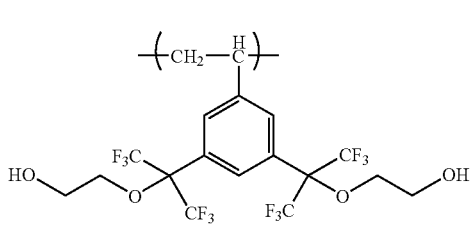
(FI-17)
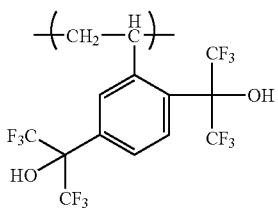
(FI-18)
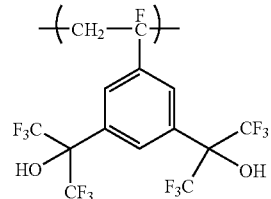
(FI-19)
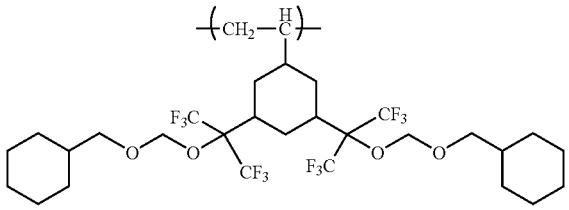
(FI-20)
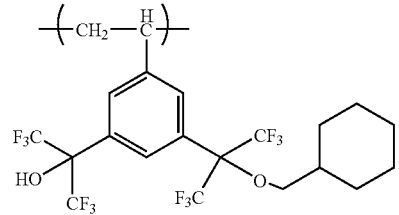
(FI-21)
Examples of the repeating units represented by general formula (FII) are shown below, but the repeating units in the invention should not be construed as being limited to the following examples.

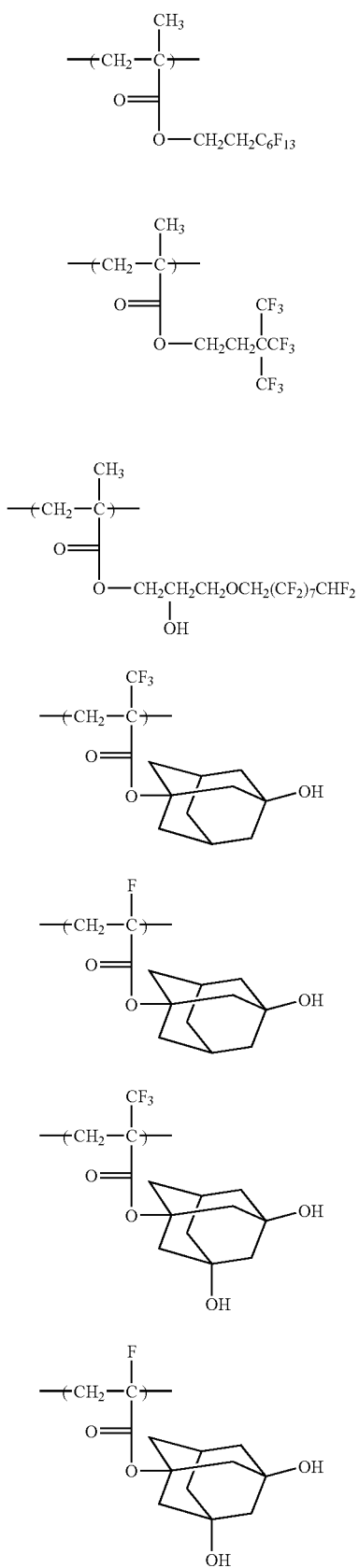
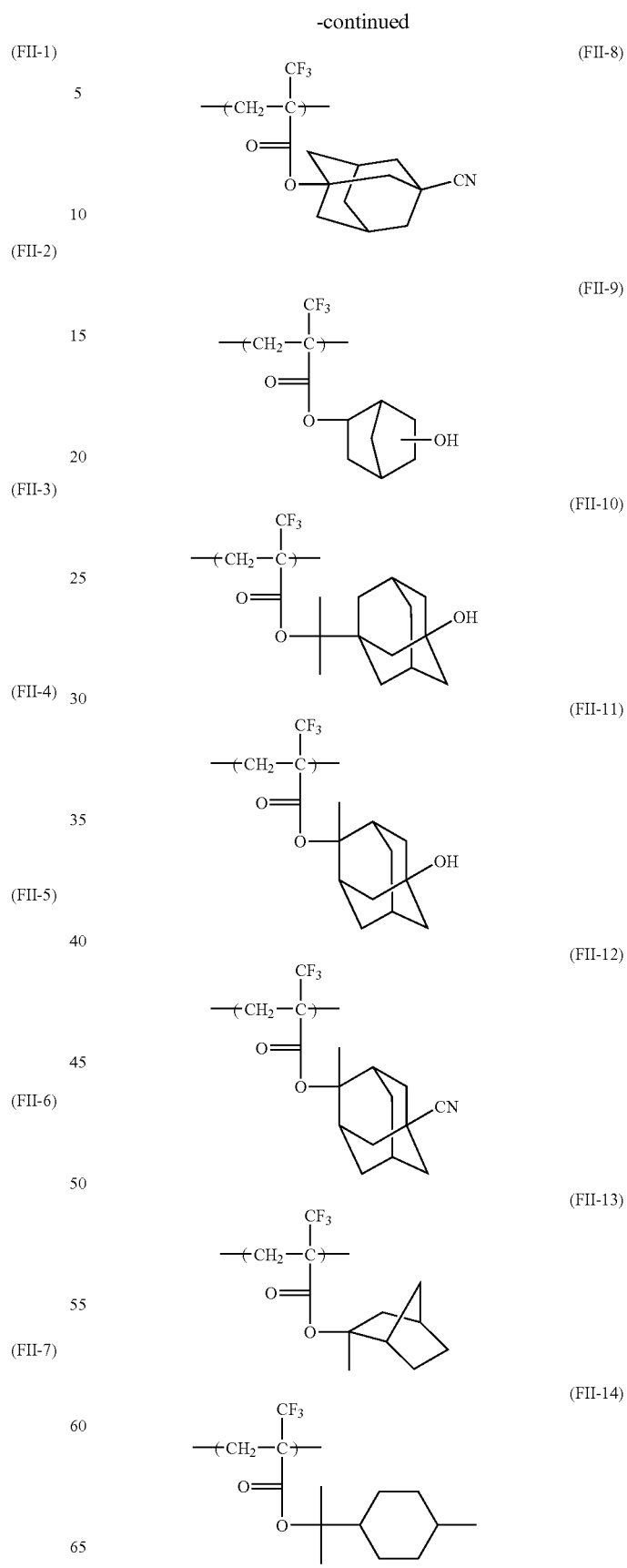

-continued (FII-15) 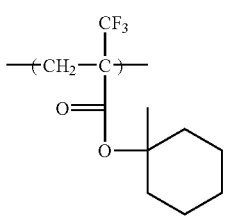

(FII-16) 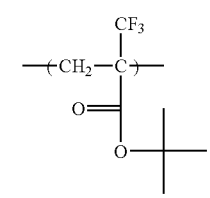

(FII-17) 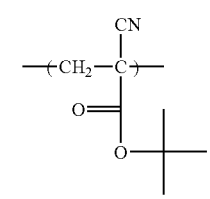

(FII-18) 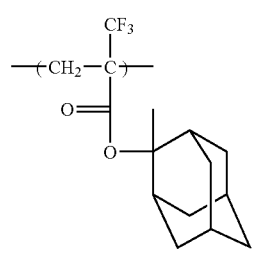

(FII-19) 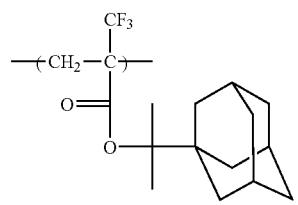

(FII-20) 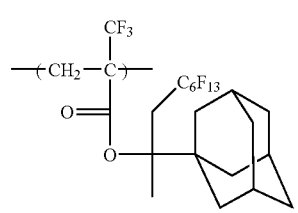

(FII-21) 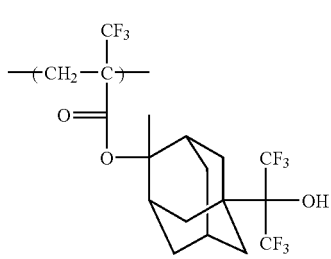

-continued (FII-22) 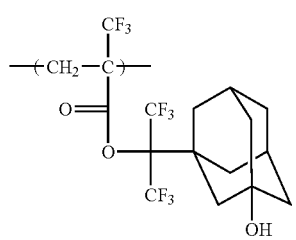

(FII-23) 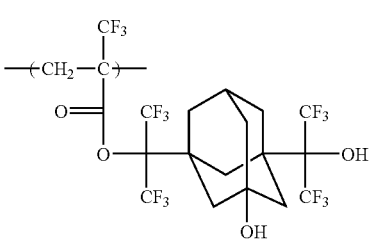

(FII-24) 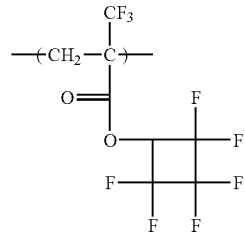

Examples of the repeating units represented by general formula (FIII) are shown below, but the repeating units in the invention should not be construed as being limited to the following examples.

(FIII-1) 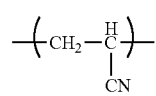

(FIII-2) 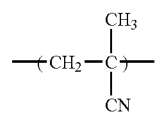

(FIII-3) 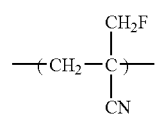

(FIII-4) 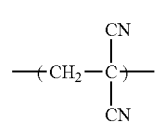

Examples of the repeating units represented by general formula (FIV) are shown below, but the repeating units in the invention should not be construed as being limited to the following examples.

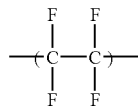 (FIV-1)

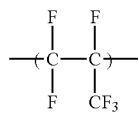 (FIV-2)

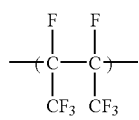 (FIV-3)

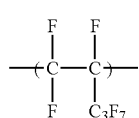 (FIV-4)

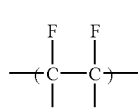 (FIV-5)

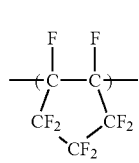 (FIV-6)

Examples of the repeating units represented by general formula (FV) are shown below, but the repeating units in the, invention should not be construed as being limited to the following examples.

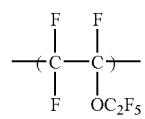 (FV-1)

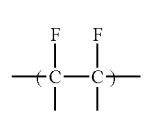 (FV-2)

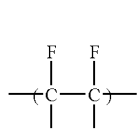 (FV-3)

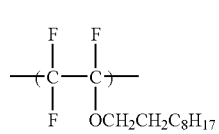 (FV-4)

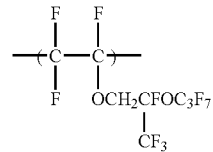 (FV-5)

Examples of the repeating units represented by general formula (FVI) are shown below, but the repeating units in the invention should not be construed as being limited to the following examples.

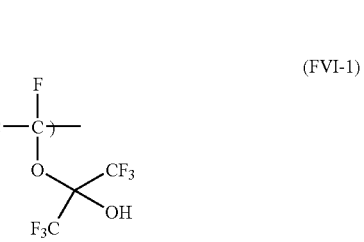 (FVI-1)

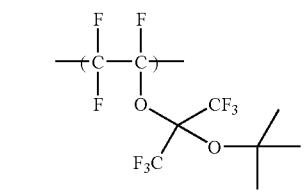 (FVI-2)

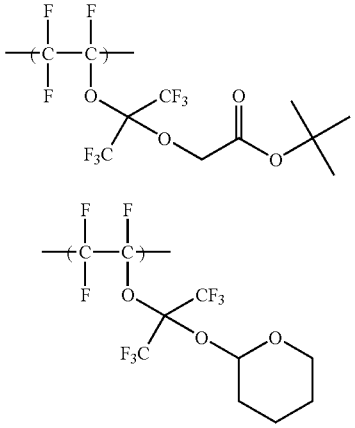 (FVI-3)

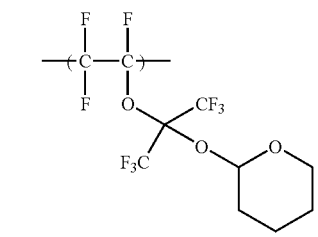 (FVI-4)

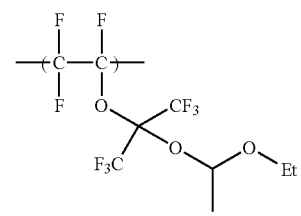 (FVI-5)

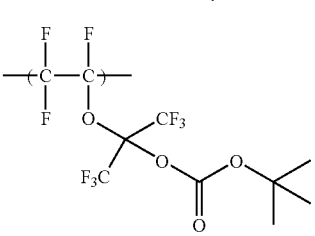 (FVI-6)

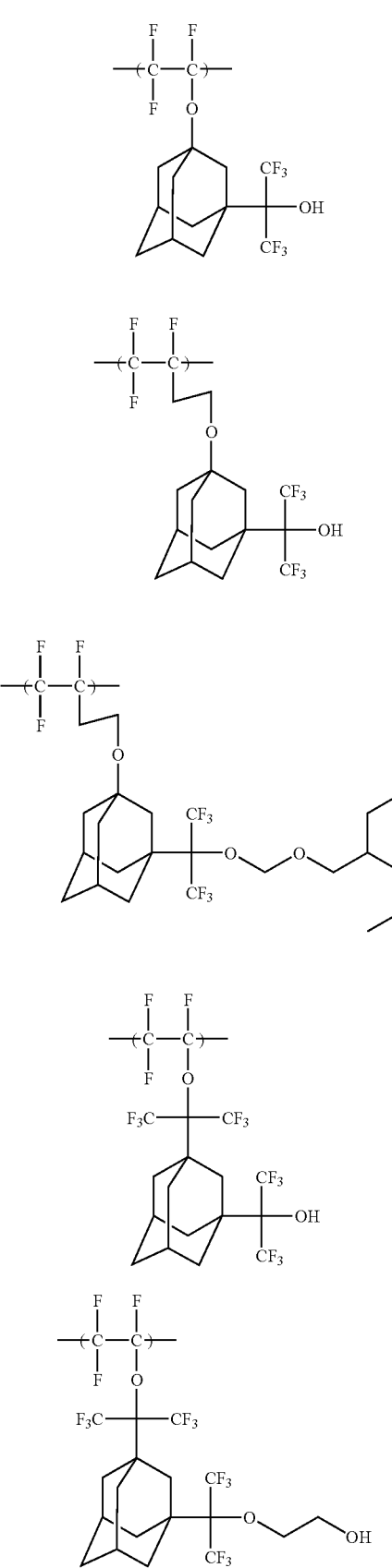
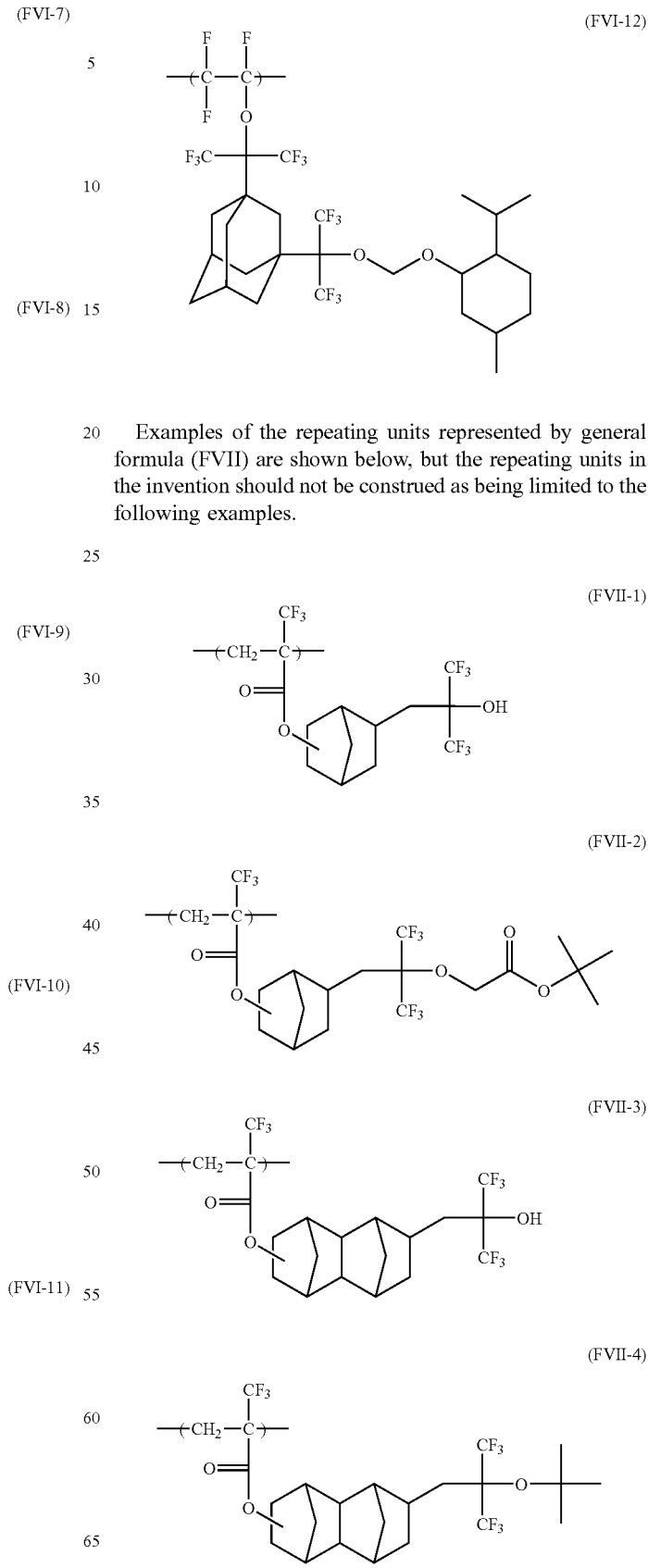
Examples of the repeating units represented by general formula (FVII) are shown below, but the repeating units in the invention should not be construed as being limited to the following examples.

-continued
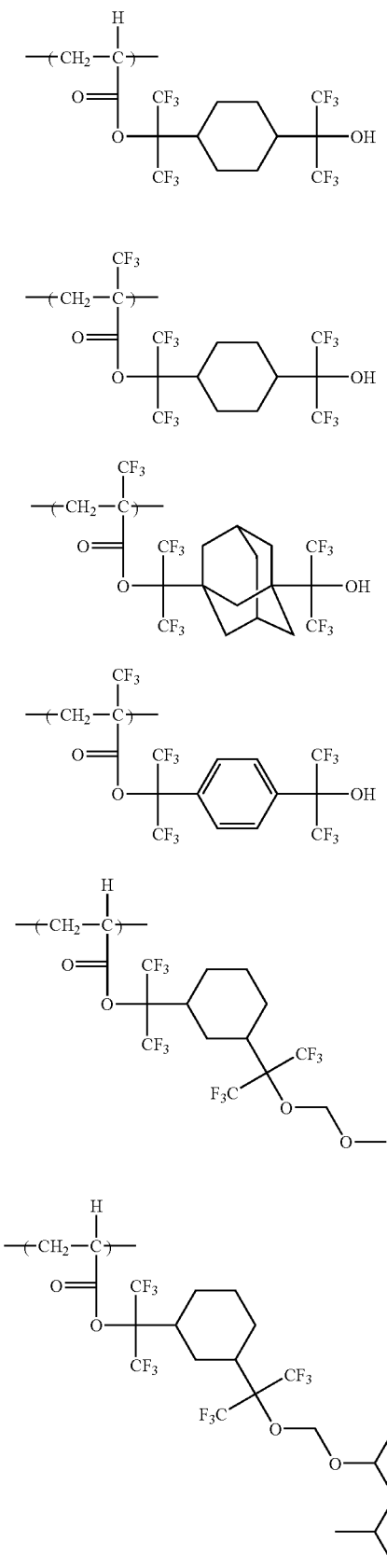
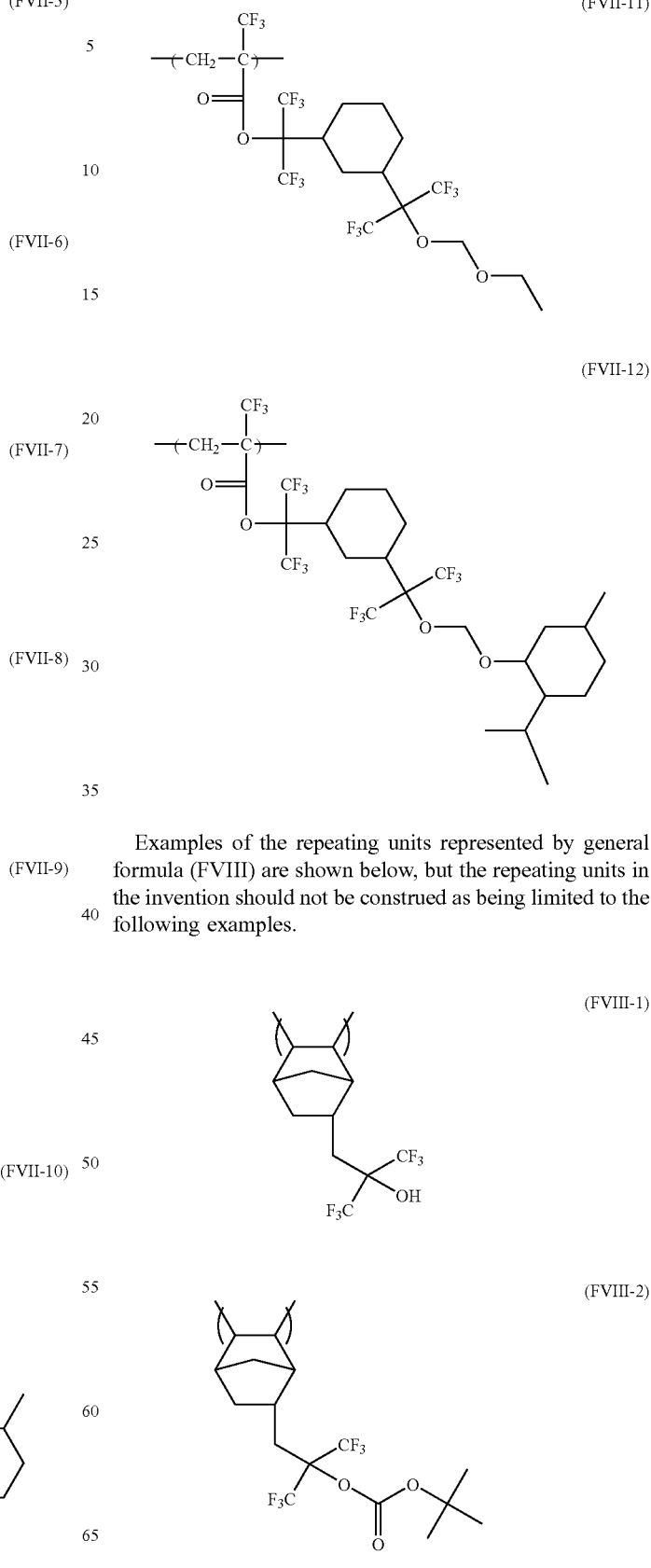
Examples of the repeating units represented by general formula (FVIII) are shown below, but the repeating units in the invention should not be construed as being limited to the following examples.

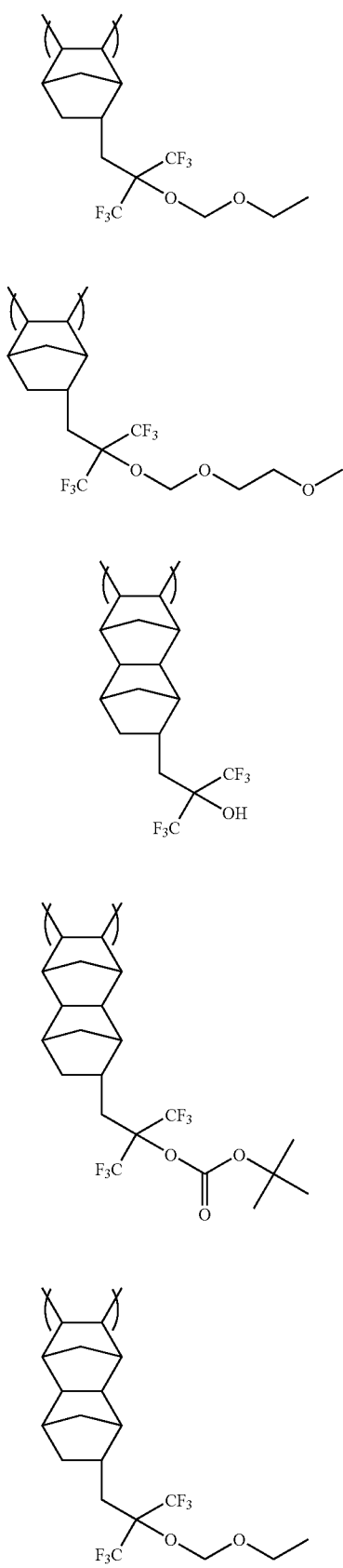
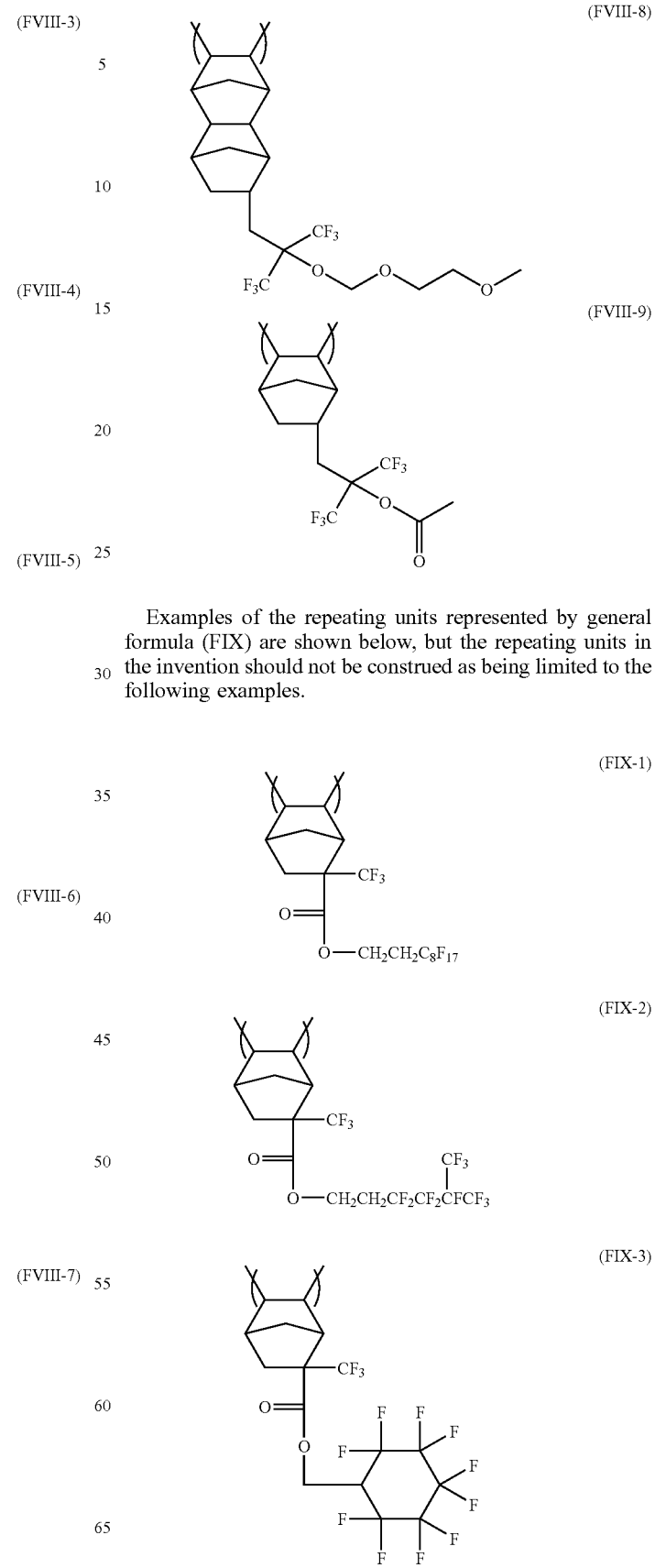
Examples of the repeating units represented by general formula (FIX) are shown below, but the repeating units in the invention should not be construed as being limited to the following examples.

-continued
(FIX-4)
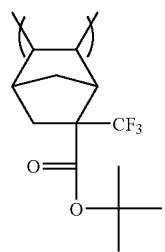
(FIX-5)
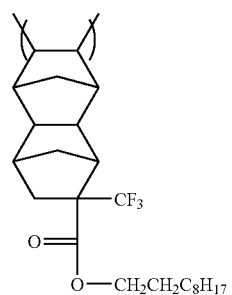
(FIX-6)
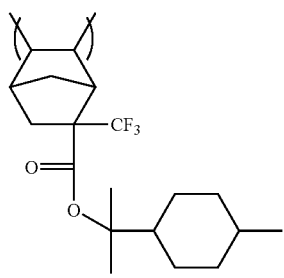
(FIX-7)
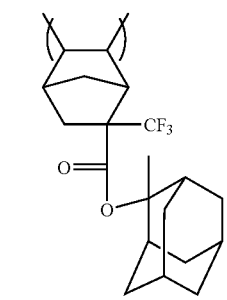
(FIX-8)
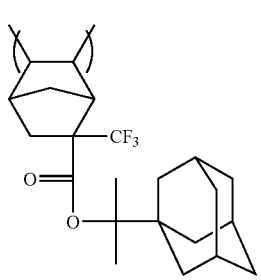
-continued
(FIX-9)
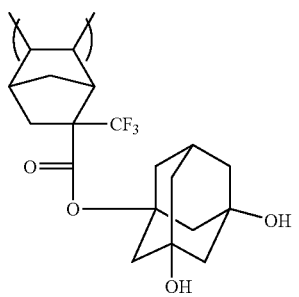
(FIX-10)
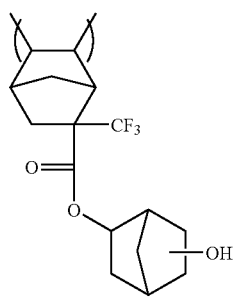
(FIX-11)
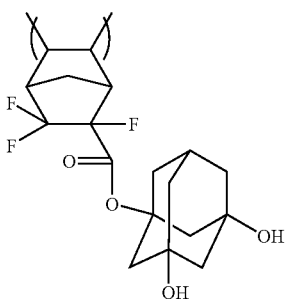
(FIX-12)
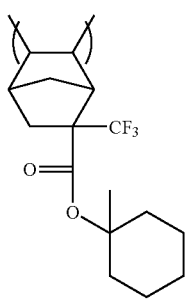
(FIX-13)
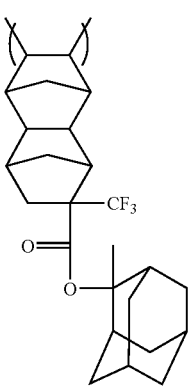

Examples of the repeating units represented by general formula (FX) are shown below, but the repeating units in the invention should not be construed as being limited to the following examples.
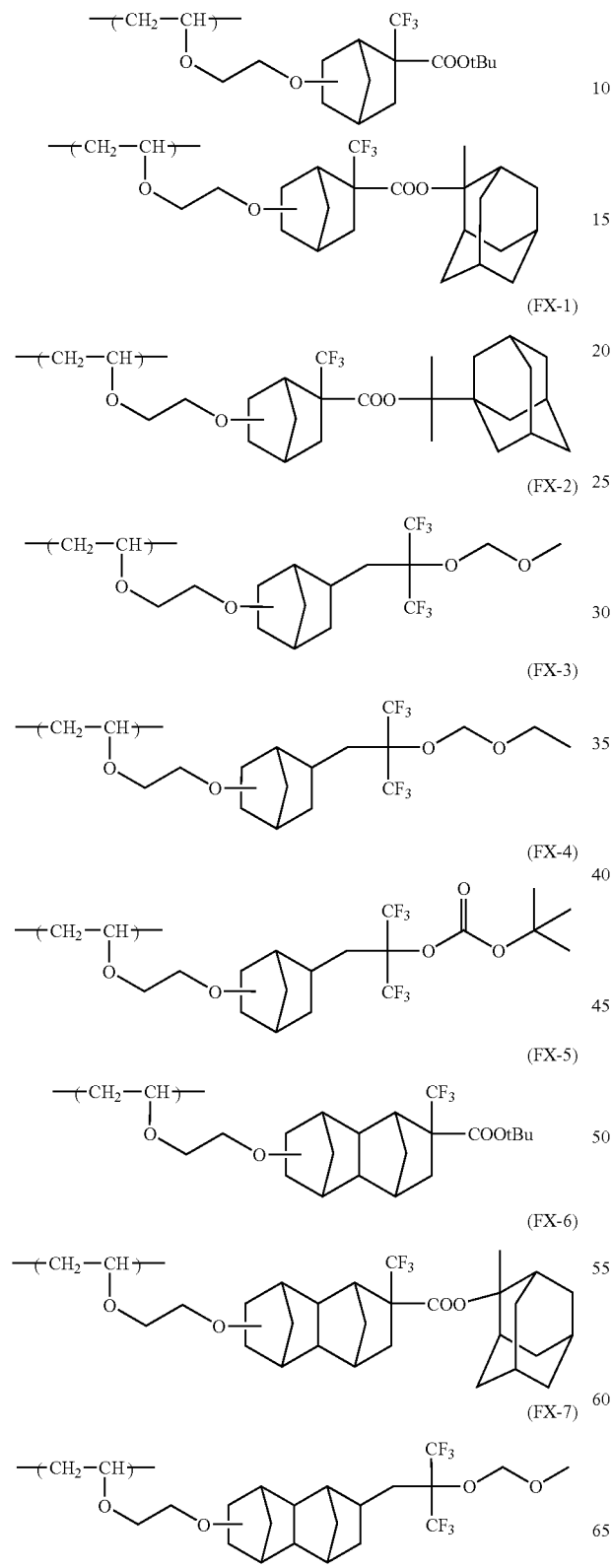
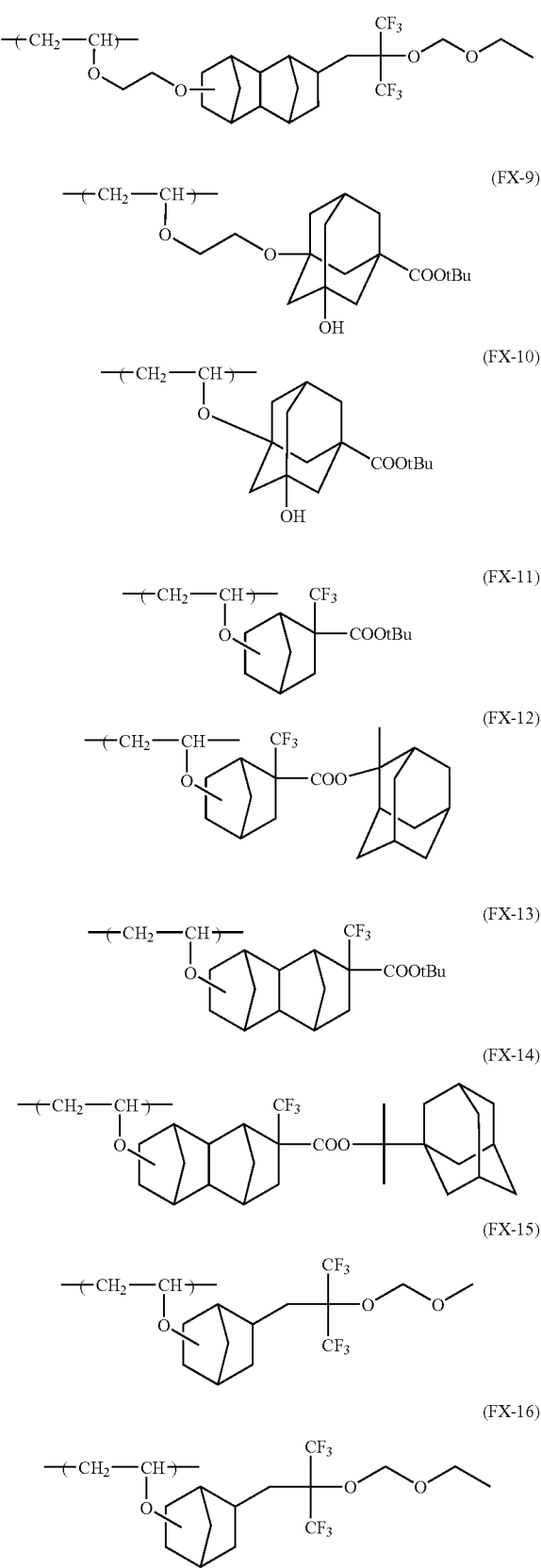

-continued
(FX-17)
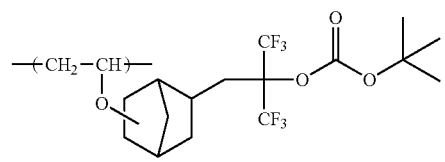
(FX-18)
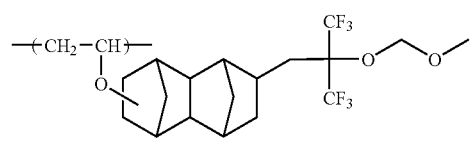
(FX-19)
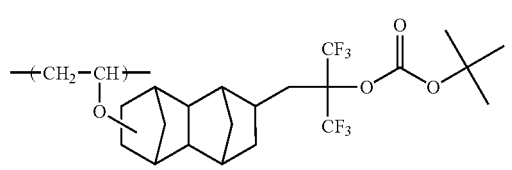
(FX-20)
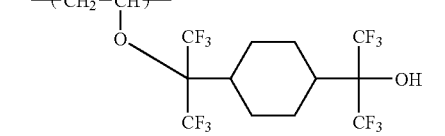
(FX-21)
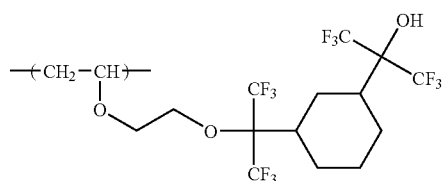
(FX-22)
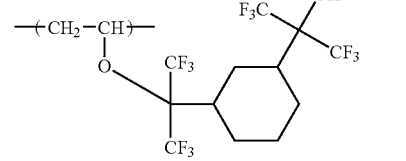
(FX-23)
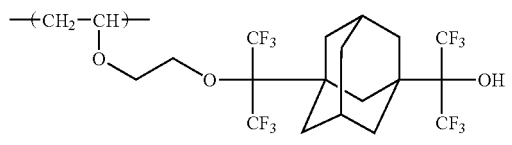
(FX-24)
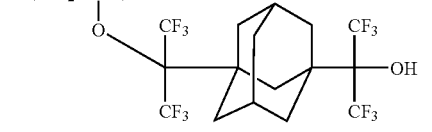
-continued
(FX-26)
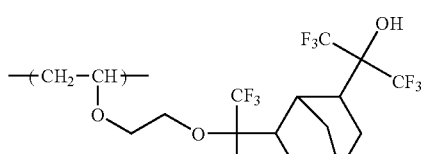
(FX-27)
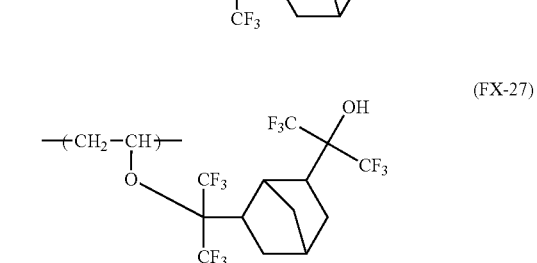
(FX-28)
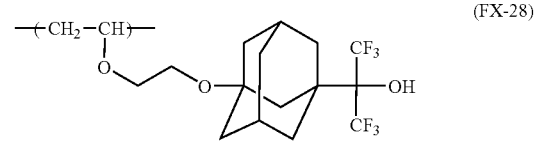
(FX-29)
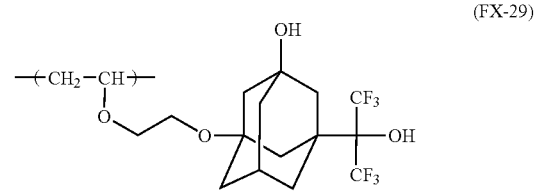
(FX-30)
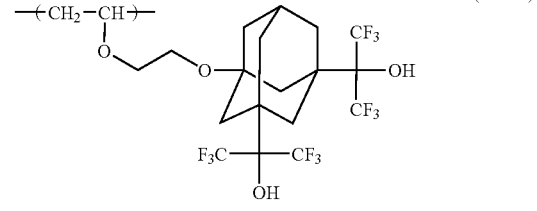
(FX-31)
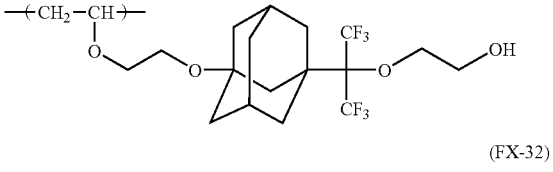
(FX-32)
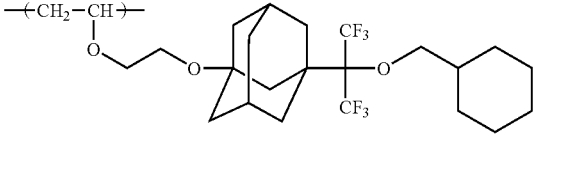
(FX-33)
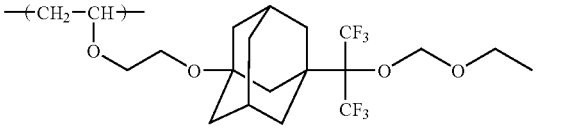
(FX-25)

-continued

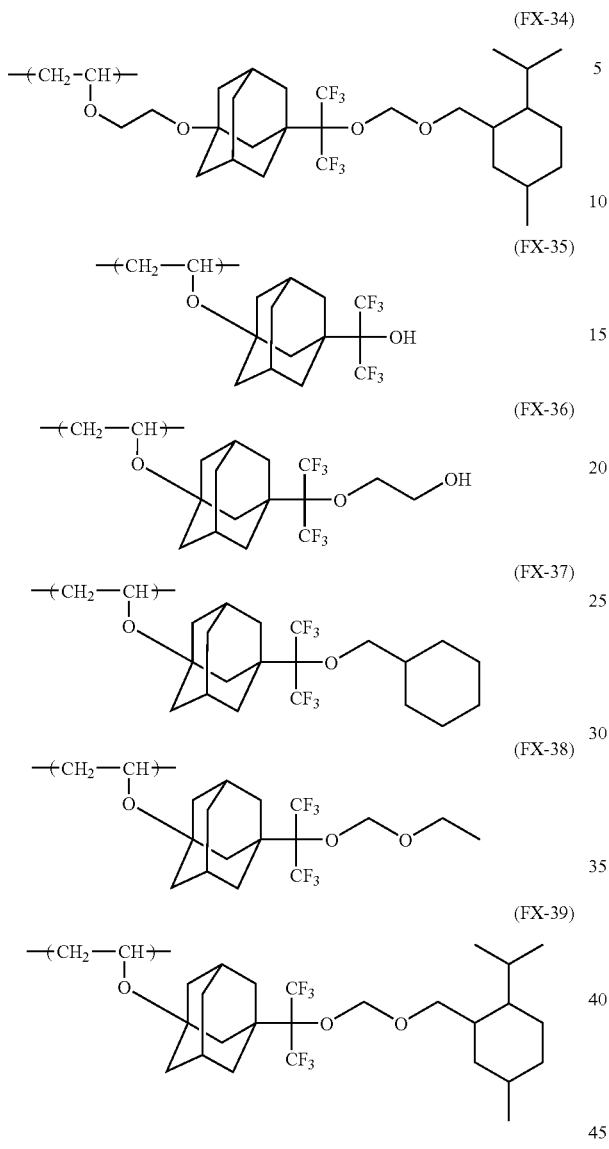

Examples of the repeating units represented by general formula (FXI) are shown below, but the repeating units in the invention should not be construed as being limited to the following examples.

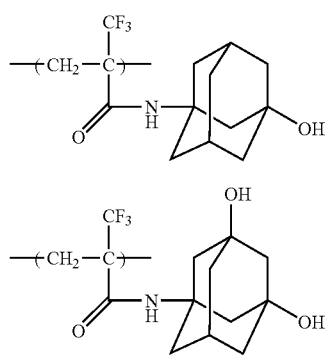

-continued

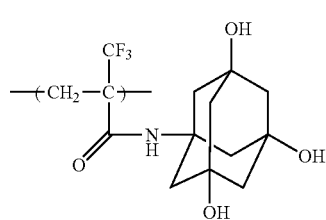

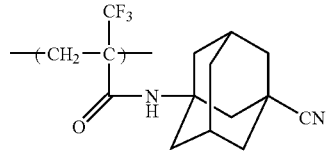

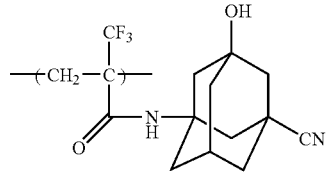

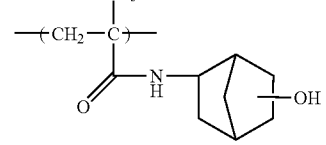

Examples of the repeating units represented by general formula (FXII) are shown below, but the repeating units in the invention should not be construed as being limited to the following examples.

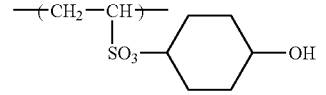

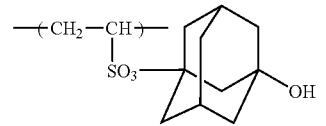

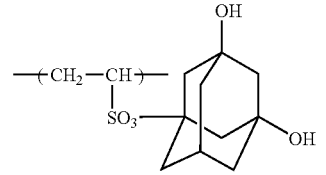

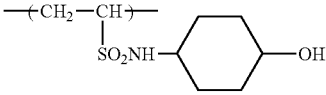

The fluorine atom-containing resin (A) may include a repeating unit having an acid-decomposable group (preferably, a repeating unit having a group where a carboxyl group is protected by an acid-decomposable group) other than the repeating units having a group represented by the general formula (Z).

Besides the monomers which form the repeating units shown above, other polymerizable monomers may be copolymerized in producing the fluorine atom-containing resin (A) for the purpose of improving the performances of the resin according to the invention.

Examples of usable comonomers include compounds having one addition-polymerizable unsaturated bond, other than those which give the repeating units shown above, selected from acrylic esters, acrylamide and derivative thereof, methacrylic esters, methacrylamide and derivatives thereof, allyl compounds, vinyl ethers, vinyl esters, styrene and derivatives thereof, crotonic esters, and the like.

Preferred examples of the resin as ingredient (A) in the invention are shown below, but the resin to be used in the invention should not be construed as being limited to the following examples.

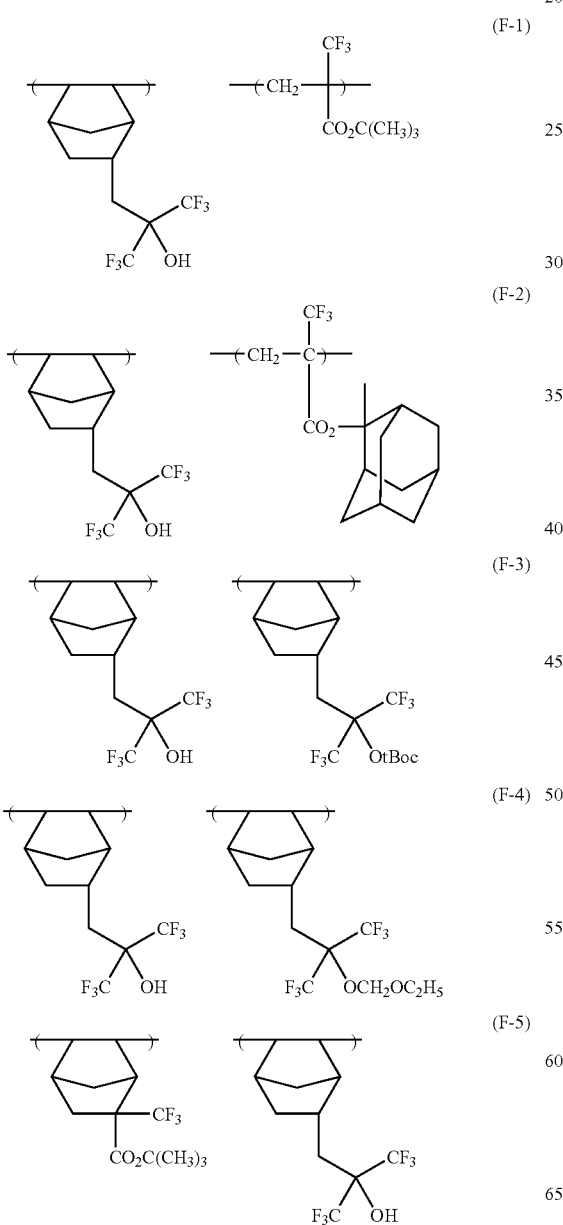
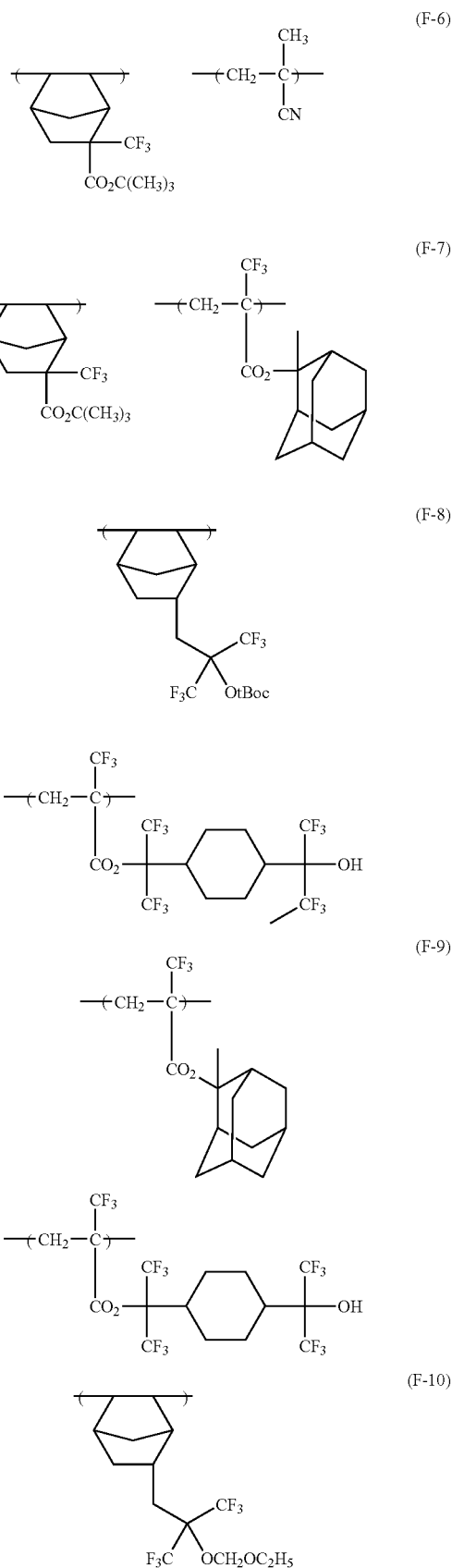

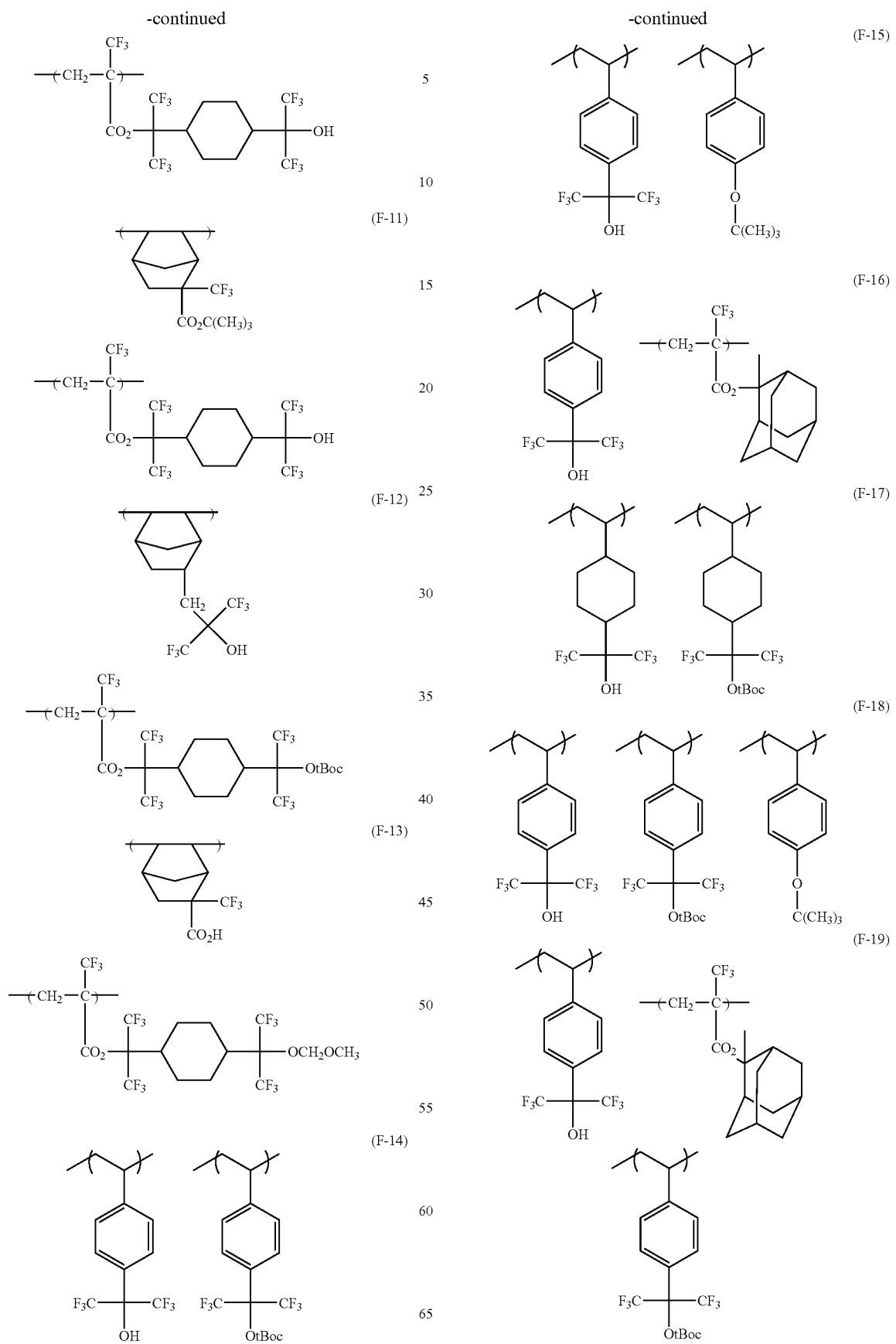

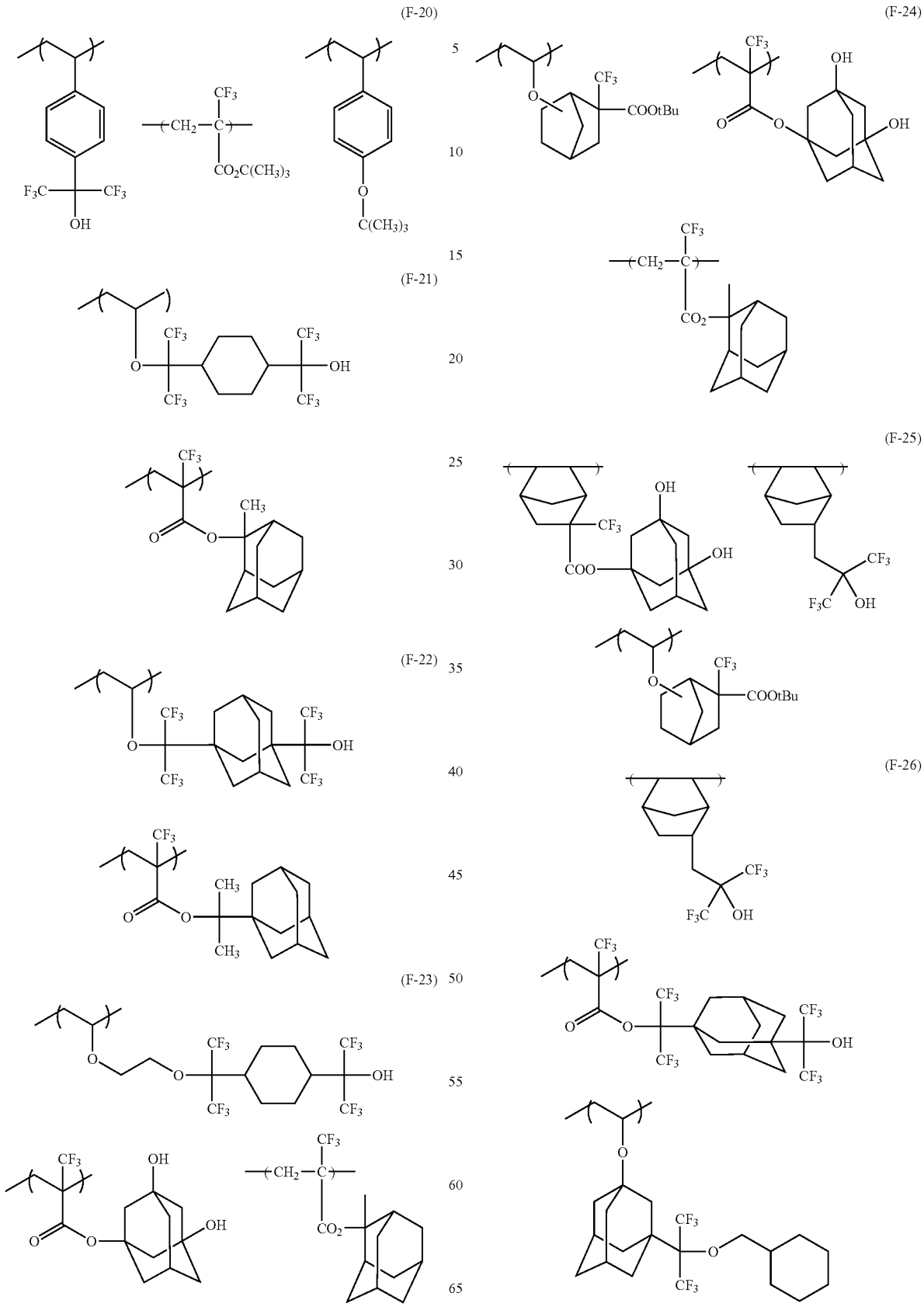

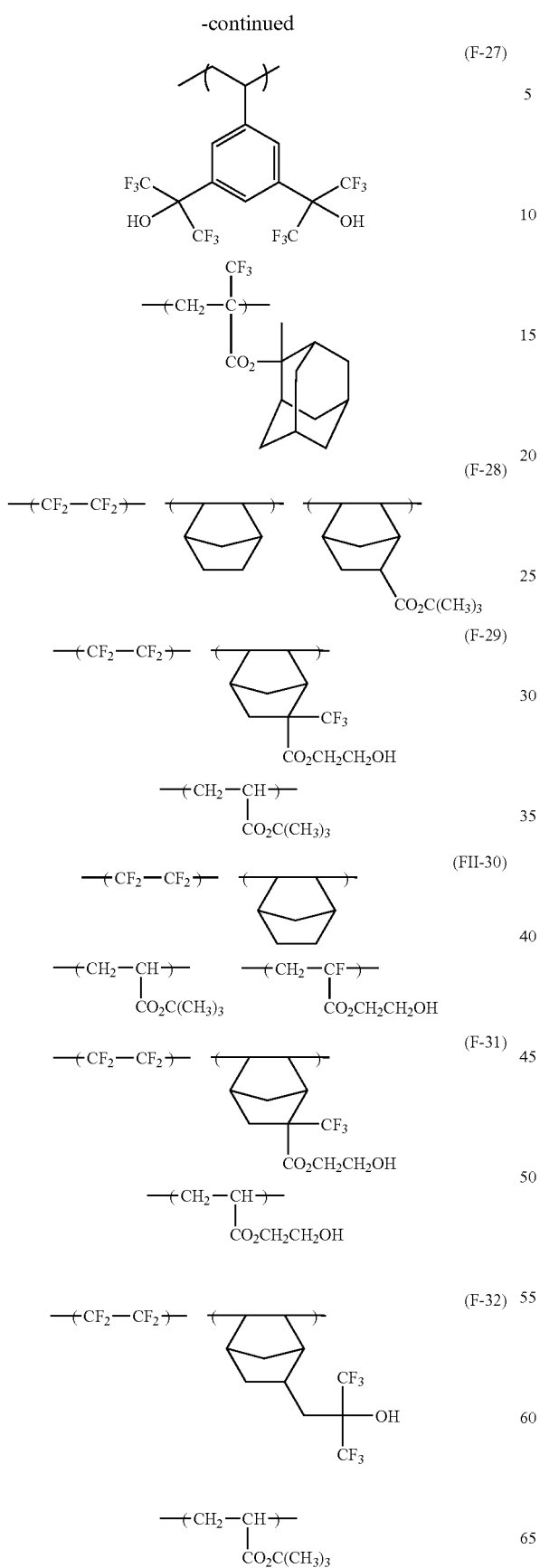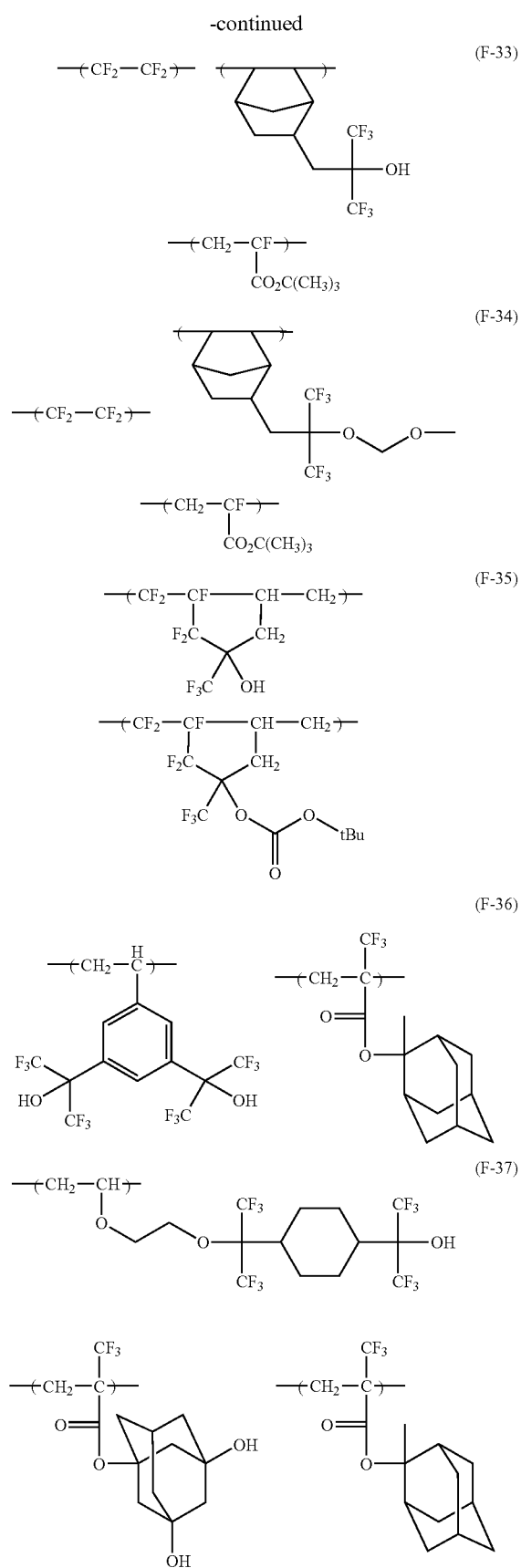

-continued

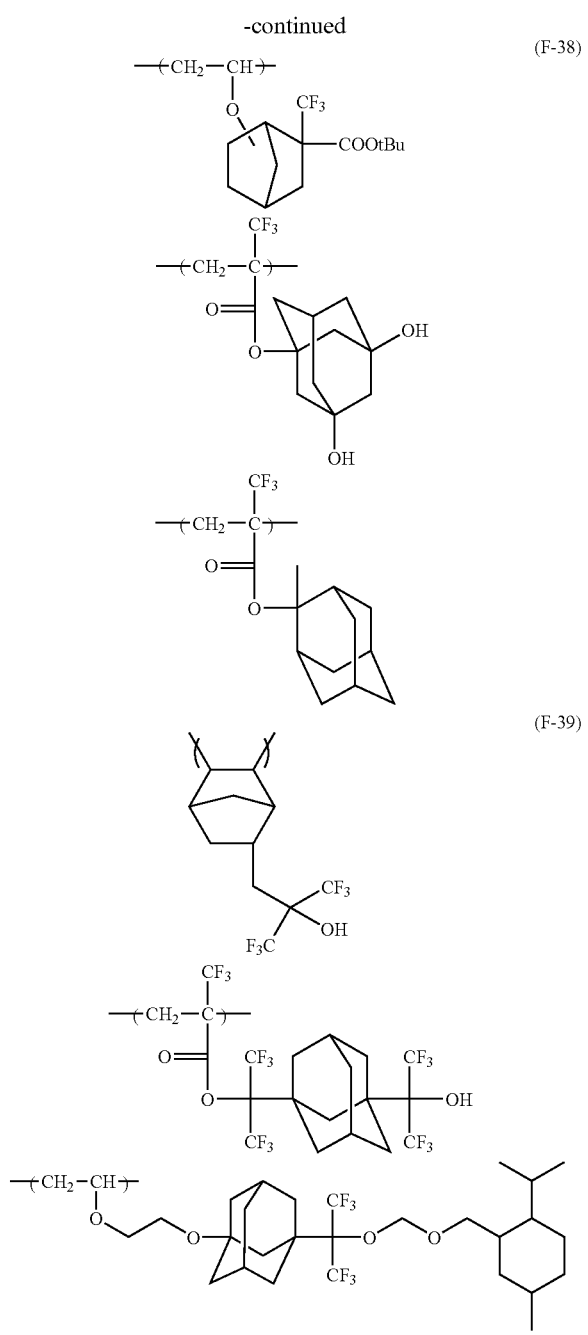

In the resin as ingredient (A), the content of the repeating units having a group represented by general formula (Z) is generally from 1 to 100% by mole, preferably from 3 to 100% by mole, more preferably from 5 to 98% by mole.

The content of the repeating units represented by general formulae (FI), (FII), (FIII), (FIV), (FV), (FVI), (FVII), (FVIII), (FIX), (FX), (FXI), and (FXII) in the fluorine atom-containing resin (A) is generally from 1 to 100% by mole preferably from 3 to 100% by mole, more preferably from 5 to 100% by mole.

The content of the repeating units having a group which dissociates by the action of an acid to become an alkali-soluble group, in the fluorine atom-containing resin (A), is generally from 1 to 80% by mole, preferably from 3 to 70% by mole, more preferably from 10 to 60% by mole.

Of the repeating units of various kinds shown above as examples, any one kind may be used alone. Alternatively, a mixture of two or more kinds may be used.

The molecular weight of resin (A) to be used in the invention is in the range of preferably from 1,000 to 200,000, more preferably from 3,000 to 200,000, in terms of weight-average molecular weight. The most preferred range thereof is from 3,000 to 50,000. The molecular-weight distribution (dispersity ratio) thereof is in the range of from 1 to 10, preferably from 1 to 3, more preferably from 1 to 2. The most preferred range thereof is from 1 to 1.7. The narrower the molecular-weight distribution, the better the applicability, sensitivity, and contrast. In the invention, the proportion of resins having a molecular weight of 1,000 or lower is preferably 20% by weight or lower, more preferably 15% by weight or lower, even more preferably 10% by weight or lower. The proportion of residual monomers in resin (A) is preferably 10% by weight or lower, more preferably 7% by weight or lower, even more preferably 5% by weight or lower.

The amount of resin (A) according to the invention to be added is in the range of generally from 50 to 99.5% by weight, preferably from 60 to 98% by weight, more preferably from 65 to 95% by weight, based on all solid components of the composition.

The acid-decomposable resin to be used in the invention can be synthesized by an ordinary method (e.g., radical polymerization). For example, a general synthesis method is as follows. Monomers are introduced into a reaction vessel either en bloc or during reaction, and dissolved in a reaction solvent according to need. This solvent, for example, is an ether such as tetrahydrofuran, 1,4-dioxane, or diisopropyl ether, a ketone such as methyl ethyl ketone or methyl isobutyl ketone, an ester solvent such as ethyl acetate, or the solvent described later in which various monomers can dissolve, such as propylene glycol monomethyl ether acetate. Thus, a homogeneous solution is obtained. Thereafter, in an inert gas atmosphere, e.g., nitrogen or argon, a commercial free-radical initiator (e.g., an azo initiator or peroxide) is used to initiate polymerization optionally with heating. According to need, the initiator may be introduced additionally or portion-wise. After completion of the reaction, the reaction mixture is poured into a solvent and the target polymer is recovered by a method for powder or solid recovery, etc. The concentration of the reactants is generally 20% by weight or higher, preferably 30% by weight or higher, more preferably 40% by weight or higher. The reaction temperature is generally from 10 to 150° C., preferably from 30 to 120° C., more preferably from 50 to 100° C. In synthesizing the resin, anionic polymerization is more suitable for some monomers. Methods of polymerization are described in Jikken Kagaku Kôza 28, Kôbunshi Gôsei, edited by The Chemical Society of Japan (Maruzen) and Shin Jikken Kagaku Kôza 19, Kôbunshi Kagaku, edited by The Chemical Society of Japan (Maruzen).

The resin as ingredient (A) in the invention preferably has an acid value of from $0.05 \times 10^{-3}$ to $6.0 \times 10^{-3}$ mol/g. The acid value thereof is more preferably from $0.1 \times 10^{-3}$ to $5.0 \times 10^{-3}$ mol/g, especially preferably from $0.2 \times 10^{-3}$ to $4.4 \times 10^{-3}$ mol/g. Examples of acid groups which influence acid value include the hydroxy and carboxyl groups in the groups represented by general formula (Z).

[2] (B) Sulfonium salt compound having one or more hydroxy groups in the cation moiety, the compound being capable of generating an acid upon irradiation with one of an actinic ray and a radiation The positive resist composition according to the invention contains as an acid generator a sulfonium salt compound which has one or more hydroxy groups in the cation moiety and generates an acid upon irradiation with actinic rays or a radiation.

The sulfonium salt compound preferably is a compound represented by general formula (A) given above.

In general formula (A), $Ra_1$ represents a hydroxy group, halogen atom, alkyl group, alkoxy group, alkoxycarbonyl group, aryl group, aryloxy group, acyl group, acylamino group, or alkylsulfonylamino group, provided that when two or more $Ra_1$'s are present in the molecule, these may be the same or different. Symbols 1, m, and n each represent an integer of 0 to 4. $X^-$ represents a non-nucleophilic anion.

It is preferred that at least one of the $Ra_1$'s is not a hydrogen atom. More preferably, at least one of the $Ra_1$'s is an alkyl or alkoxy group. Most preferably, the $Ra_1$ on the aromatic group having a hydroxy group is an alkyl group. This sulfonium salt compound can have improved solubility in solvents while retaining intact solubility in a developing solution.

Examples of the halogen atom represented by $Ra_1$ include fluorine, chlorine, bromine, and iodine atoms.

Preferred examples of the alkyl group represented by $Ra_1$ and of the alkyl group in each of the alkoxy, alkoxycarbonyl, and alkyl sulfonyl amino groups represented by $Ra_1$ include linear, branched, and cyclic alkyl groups having 1 to 10 carbon atoms. Specific examples thereof include methyl, ethyl, propyl, n-butyl, sec-butyl, t-butyl, pentyl, cyclopentyl, hexyl, and cyclohexyl. The alkyl groups each may have an oxygen atom, sulfur atom, carbonyl group, or the like in the alkyl chain.

Preferred examples of the aryl group represented by $Ra_1$ and of the aryl group in the aryloxy group represented by $Ra_1$ include aryl groups having 4 to 14 carbon atoms. Specific examples thereof include phenyl, tolyl, and naphthyl.

Preferred examples of the acyl group represented by $Ra_1$ and of the acyl group in the acylamino group represented by $Ra_1$ include acyl groups having 1 to 10 carbon atoms. Specific examples thereof include acetyl, propanoyl, butanoyl, and benzoyl.

The alkyl, alkoxy, alkoxycarbonyl, aryl, aryloxy, acyl, acylamino, alkylsulfonylamino, and other groups represented by $Ra_1$ may have one or more substituents. Examples of the substituents include halogen atoms, nitro, carboxyl, hydroxy, oxo, amino, cyano, and alkoxy groups (preferably having 1 to 5 carbon atoms). Preferred substituents for the alkyl and alkoxy groups are halogen atoms.

Examples of the non-nucleophilic anion represented by $X^-$ include sulfonic acid anions, carboxylic acid anions, bis(alkylsulfonyl)imide anions, and tris(alkylsulfonyl)methyl anions.

A non-nucleophilic anion is an anion the ability of which to undergo a nucleophilic reaction is considerably low and which can inhibit the decomposition with time caused by an intramolecular nucleophilic reaction. The non-nucleophilic anion improves the long-term stability of resists.

Examples of the sulfonic acid anions include alkylsulfonic acid anions, arylsulfonic acid anions, and camphorsulfonic acid anions.

Examples of the carboxylic acid anions include alkylcarboxylic acid anions, arylcarboxylic acid anions, and aralkylcarboxylic acid anions.

Preferred examples of the alkyl groups in the alkylsulfonic acid anions include alkyl groups having 1 to 30 carbon atoms, such as methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, eicosyl, cyclopropyl, cyclopentyl, cyclohexyl, adamantyl, norbornyl, and bornyl.

Preferred examples of the aryl groups in the arylsulfonic acid anions include aryl groups having 6 to 14 carbon atoms, such as phenyl, tolyl, and naphthyl.

The alkyl groups and aryl groups in the alkylsulfonic acid anions and arylsulfonic acid anions may have one or more substituents.

Examples of the substituents include halogen atoms, alkyl groups, alkoxy groups, and alkylthio groups.

Examples of the halogen atoms include chlorine, bromine, fluorine, and iodine atoms.

Preferred examples of the alkyl groups include alkyl groups having 1 to 15 carbon atoms, such as methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, and eicosyl.

Preferred examples of the alkoxy groups include alkoxy groups having 1 to 5 carbon atoms, such as methoxy, ethoxy, propoxy, and butoxy.

Preferred examples of the alkylthio groups include alkylthio groups having 1 to 15 carbon atoms, such as methylthio, ethylthio, propylthio, isopropylthio, n-butylthio, isobutylthio, sec-butylthio, pentylthio, neopentylthio, hexylthio, heptylthio, octylthio, nonylthio, decylthio, undecylthio, dodecylthio, tridecylthio, tetradecylthio, pentadecylthio, hexadecylthio, heptadecylthio, octadecylthio, nonadecylthio, and eicosylthio. The alkyl groups, alkoxy groups, and alkylthio groups may have been further substituted with one or more halogen atoms (preferably fluorine atoms).

Examples of the alkyl groups in the alkylcarboxylic acid anions include the same alkyl groups as those enumerated above with regard to the alkylsulfonic acid anions.

Examples of the aryl groups in the arylcarboxylic acid anions include the same aryl groups as those enumerated above with regard to the arylsulfonic acid anions.

Preferred examples of the aralkyl groups in the aralkylcarboxylic acid anions include aralkyl groups having 6 to 12 carbon atoms, such as benzyl, phenethyl, naphthylmethyl, naphthylethyl, and naphthylbutyl.

The alkyl groups, aryl groups, and aralkyl groups in the alkylcarboxylic acid anions, arylcarboxylic acid anions, and aralkylcarboxylic acid anions may have one or more substituents. Examples of the substituents include the same halogen atoms, alkyl groups, alkoxy groups, and alkylthio groups as those enumerated above with regard to the arylsulfonic acid anions.

The alkyl groups in the bis(alkylsulfonyl) imide anions and tris(alkylsulfonyl)methyl anions preferably are alkyl groups having 1 to 5 carbon atoms. Examples thereof include methyl, ethyl, propyl, isopropyl, n-butyl, isobutyl, sec-butyl, pentyl, and neopentyl. These alkyl groups may have one or more substituents. Examples of the substituents include halogen atoms, alkoxy groups, and alkylthio groups.

Especially preferred examples of the anions include alkanesulfonic acid anions substituted with one or more fluorine atoms and benzenesulfonic acid anions substituted with one or more fluorine atoms or groups each having one or more fluorine atoms. The alkanesulfonic acid anions substituted with one or more fluorine atoms preferably are perfluoroalkanesulfonic acid anions. Especially preferred examples thereof include a nonafluorobutanesulfonic acid anion and perfluorooctanesulfonic acid anion.

Examples of the benzenesulfonic acid anions substituted with one or more fluorine atoms or groups each having one or more fluorine atoms include benzenesulfonic acid anions substituted with 1 to 5 fluorine atoms and benzenesulfonic acid anions substituted with one or more fluoroalkyl groups. Especially preferred examples thereof include a pentafluorobenzenesulfonic acid anion and trifluoromethyl- or bistrifluoromethylbenzenesulfonic acid anion.

Other examples of the non-nucleophilic anion include phosphorus fluoride, boron fluoride, and antimony fluoride.

Preferred examples of the sulfonium salt compound as ingredient (B) are shown below, but the compound for use in the invention should not be construed as being limited to the following examples.

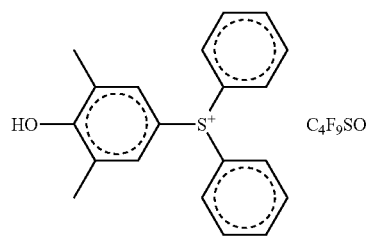

I-1

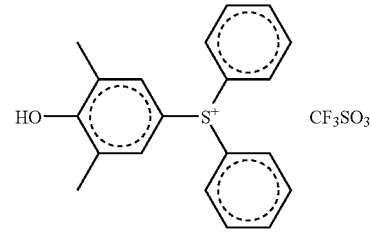

I-2

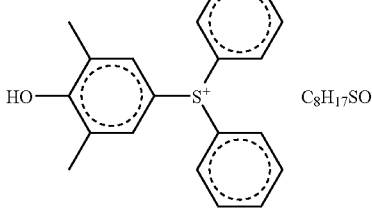

I-3

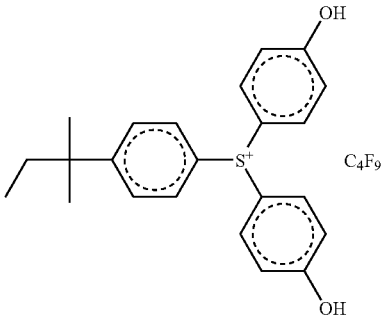

I-4

-continued

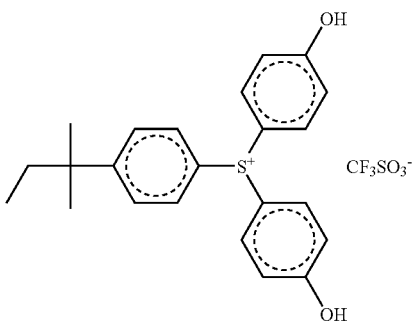

I-5

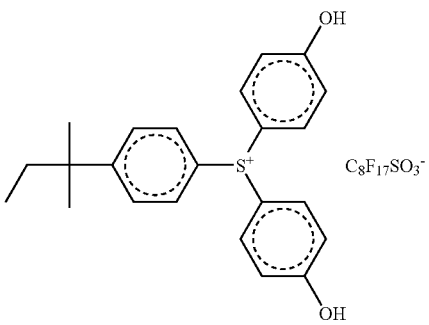

I-6

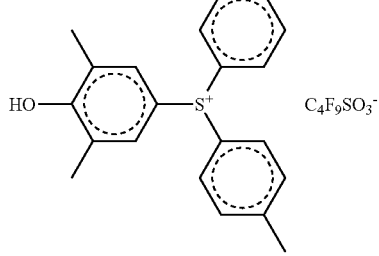

I-7

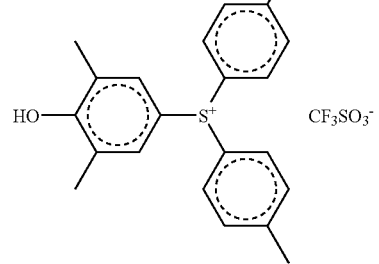

I-8

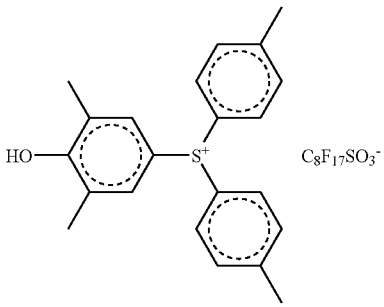

I-9

-continued
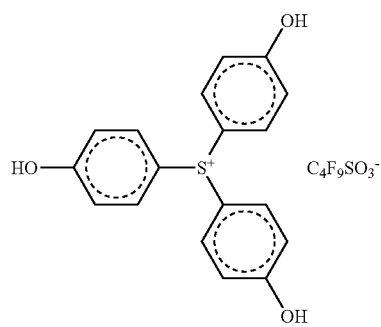
I-10
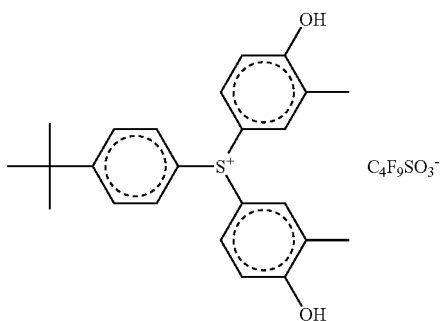
I-15
I-11
I-16
I-12
I-17
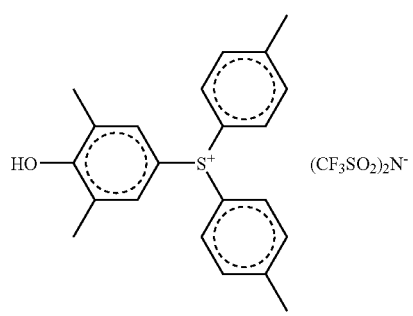
I-13
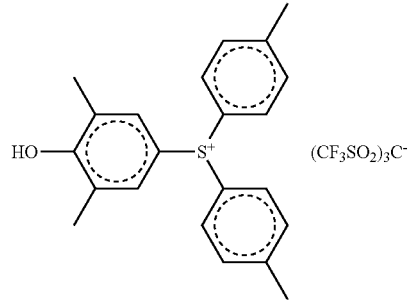
I-18
I-14
I-19
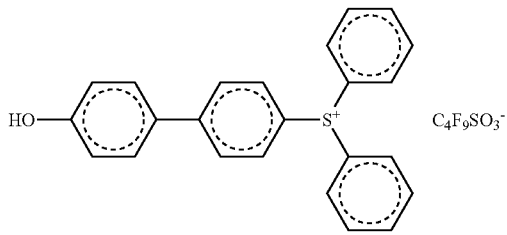
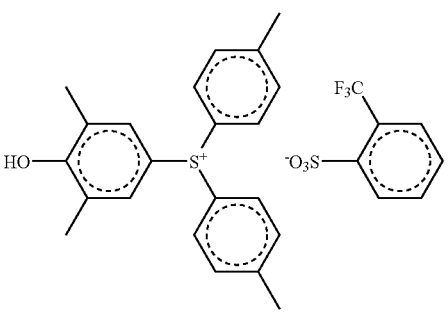

-continued
I-20
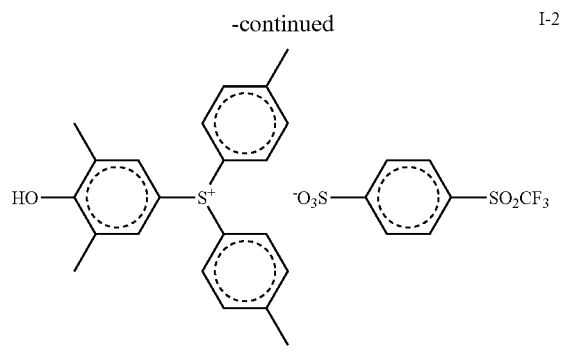
I-21
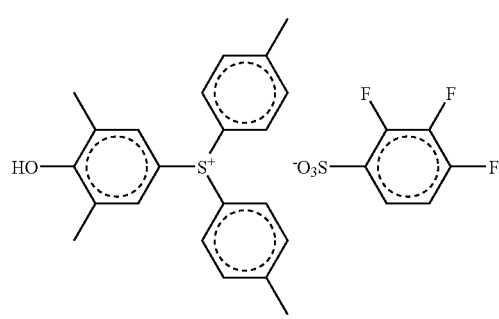
I-22
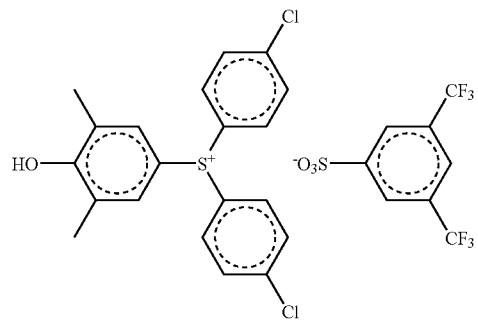
I-23
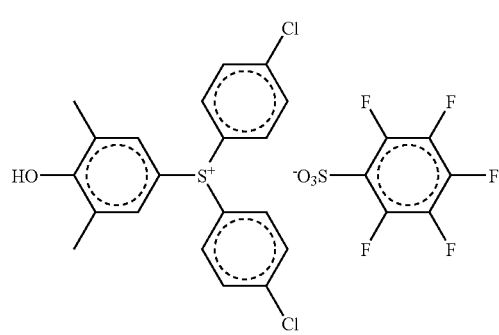
I-24
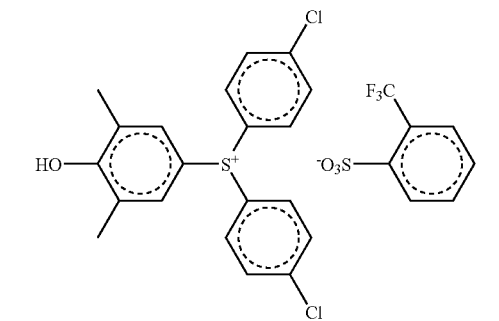
-continued
I-25
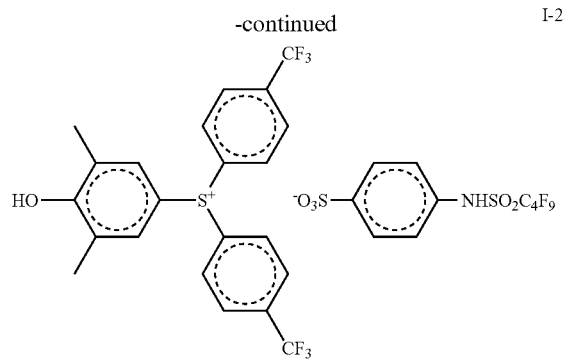
I-26
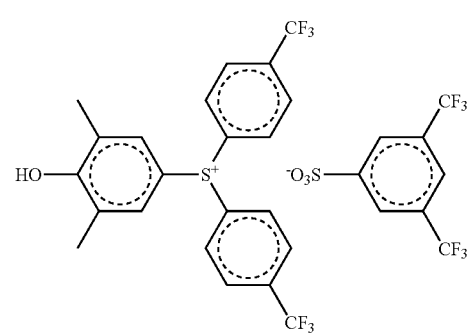
I-27
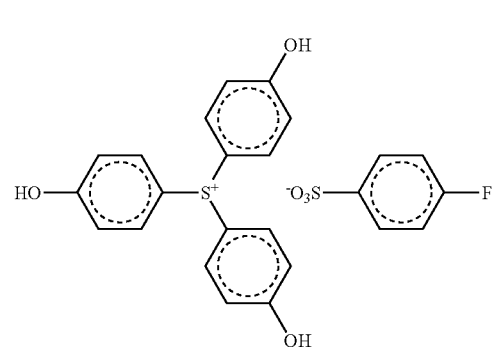
I-28
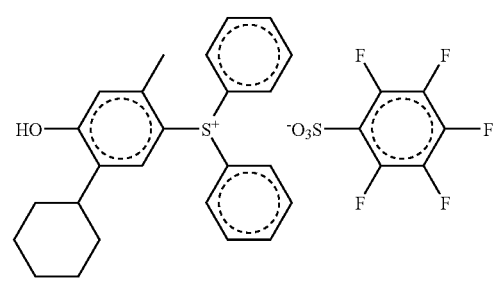
I-29
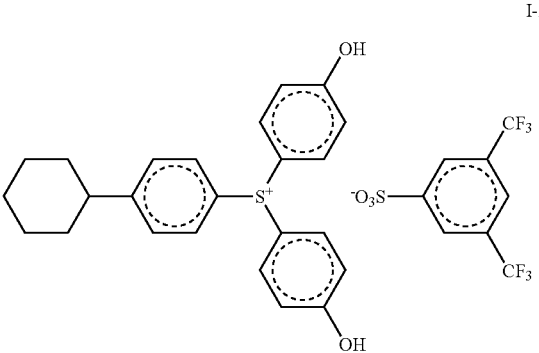

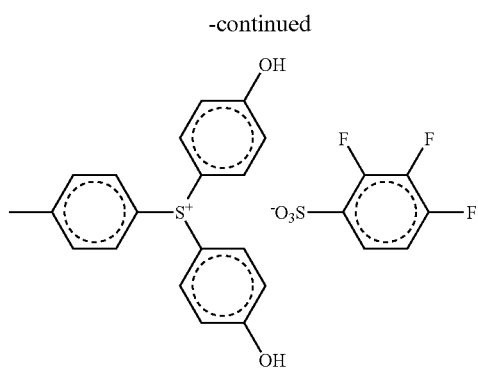
I-30
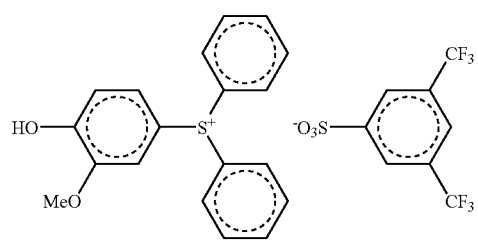
I-31
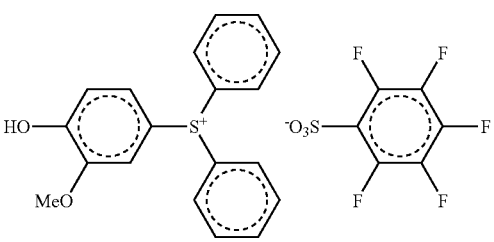
I-32
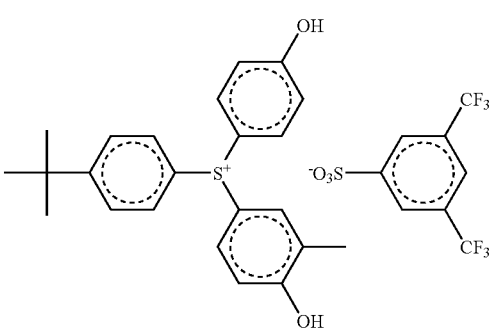
I-33
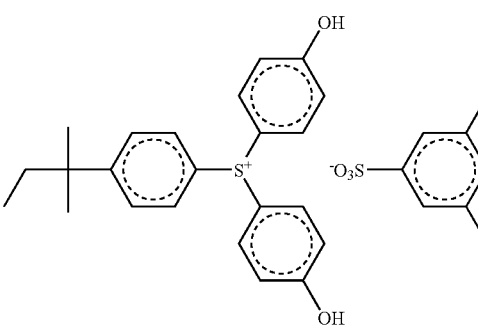
I-34
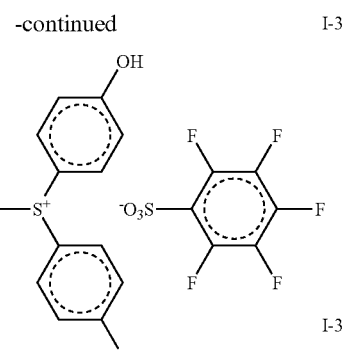
I-35
I-36
I-37
I-38
I-39

-continued
I-40
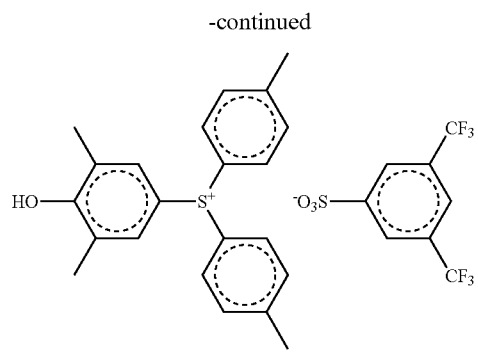
I-41
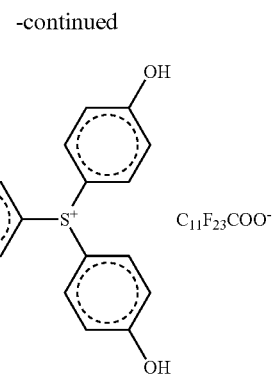
I-42
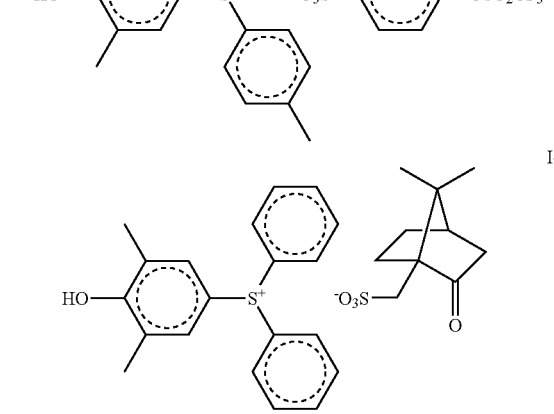
I-43
I-44
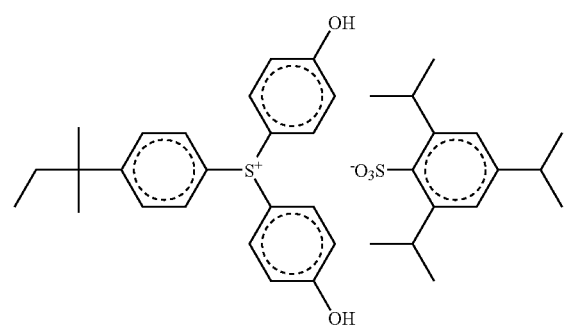
-continued
I-45
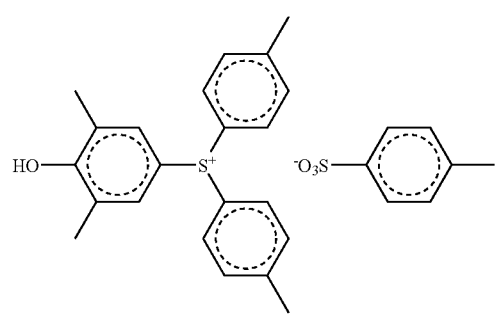
I-46
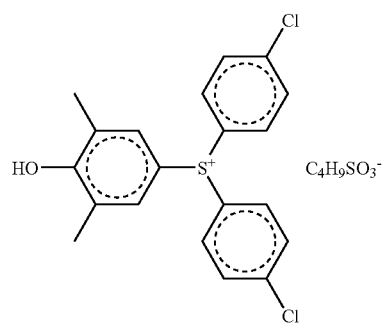
I-47
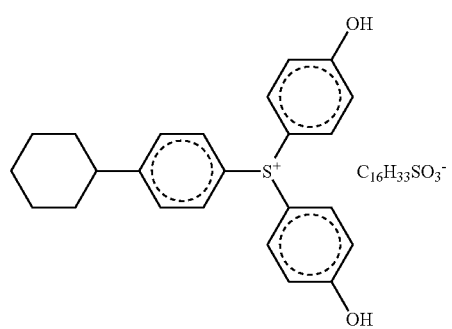
I-48
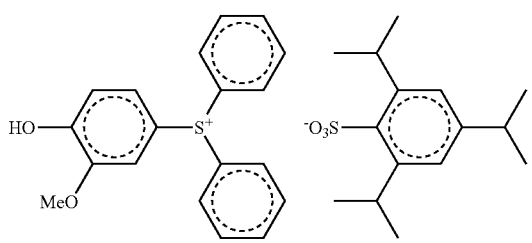
I-49

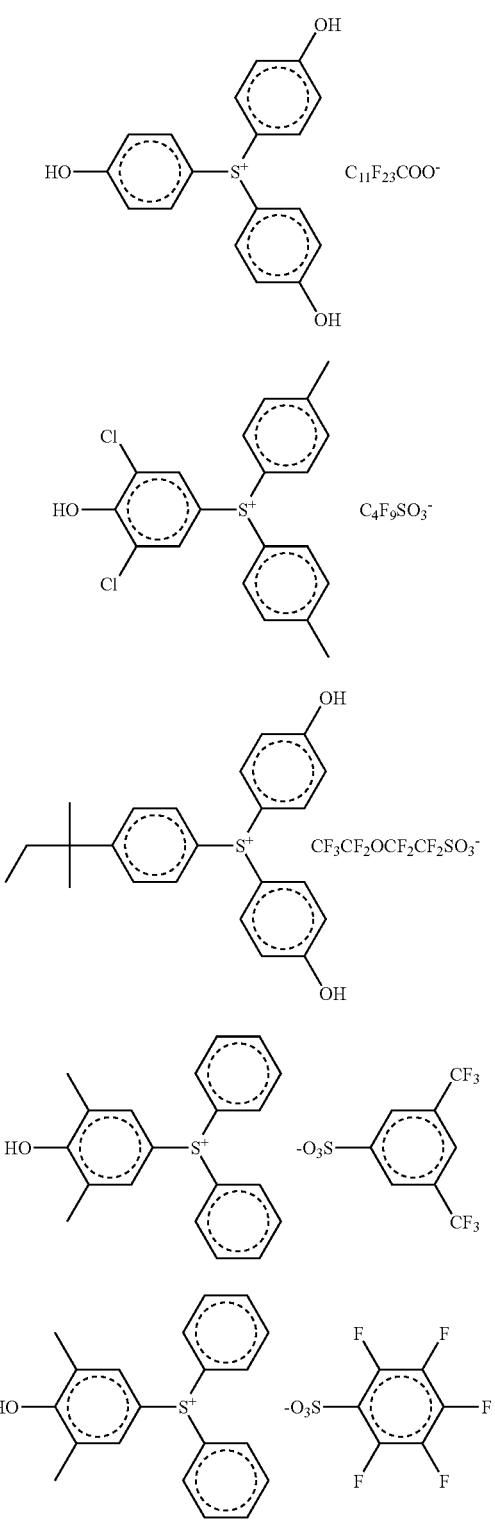

The sulfonium salt compounds (B) described above can be used alone or in combination of two or more thereof.

The content of the sulfonium salt compound as ingredient (B) in the positive resist composition of the invention is preferably from 0.1 to 20% by weight, more preferably from 0.5 to 10% by weight, even more preferably from 1 to 7% by weight, based on the solid components of the composition.

Acid Generators Usable Besides Ingredient (B)

In the invention, ingredient (B) may be used in combination with one or more compounds which decompose upon irradiation with actinic rays or a radiation to generate an acid.

The amount of the photo-acid generators which can be used in combination with ingredient (B) according to the invention is such that the proportion of ingredient (B)/other acid generators by mole is generally from 100/0 to 20/80, preferably from 100/0 to 40/60, more preferably from 100/0 to 50/50.

Such photo-acid generators usable with ingredient (B) can be suitably selected from photoinitiators for cationic photopolymerization, photoinitiators for radical photopolymerization, photodecolorants or optical color changers for dyes, known compounds used in microresist formation or the like which generate an acid upon irradiation with actinic rays or a radiation, and mixtures of two or more thereof.

Examples thereof include diazonium salts, phosphonium salts, sulfonium salts, iodonium salts, imidesulfonates, oximesulfonates, diazo disulfones, disulfones, and o-nitrobenzyl sulfonates.

A compound obtained by incorporating such a group or compound which generates an acid upon irradiation with actinic rays or a radiation into the main chain or side chains of a polymer can be used. Such polymeric compounds are described in, e.g., U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Also usable are the compounds generating an acid by the action of light which are described in, e.g., U.S. Pat. No. 3,779,778 and European Patent 126,712.

Examples of especially preferred compounds among those optionally usable compounds which decompose upon irradiation with actinic rays or a radiation to generate an acid include compounds represented by the following general formulae (ZI), (ZII), and (ZIII).

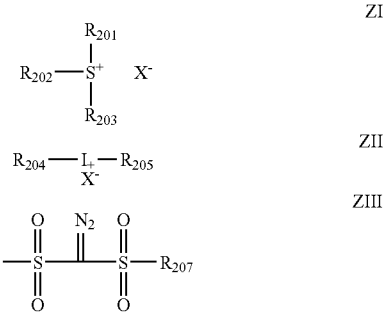

In general formula (ZI), $R_{201}$, $R_{202}$, and $R_{203}$ each independently represent an organic group.

$X^-$ represents a non-nucleophilic anion. Examples thereof include the same anions as those enumerated above as examples of the non-nucleophilic anion represented by $X^-$ in general formula (A).

The organic groups represented by $R_{201}$, $R_{202}$, and $R_{203}$ have generally 1 to 30, preferably 1 to 20 carbon atoms.

Two of $R_{201}$ to $R_{203}$ may be bonded to each other to form a ring structure. The ring may contain an oxygen atom, sulfur atom, ester bond, amide bond, or carbonyl group.

Examples of the group formed by the bonding of two of $R_{201}$ to $R_{203}$ include alkylene groups (e.g., butylene and pentylene).

Specific examples of the organic groups represented by $R_{201}$, $R_{202}$, and $R_{203}$ include the corresponding groups in the compounds (ZI-1), (ZI-2), and (ZI-3) which will be described later.

A compound having two or more structures each represented by general formula (ZI) may be used. For example, it may be a compound having a structure which is constituted of two compounds represented by general formula (ZI) and in which at least one of the $R_{201}$ to $R_{203}$ in one of the two compounds is bonded to at least one of the $R_{201}$ to $R_{203}$ in the other compound.

Preferred examples of ingredient (ZI) include compounds (ZI-1), (ZI-2), and (ZI-3) described below.

Compound (ZI-1) is an arylsulfonium compound represented by general formula (ZI) in which at least one of $R_{201}$ to $R_{203}$ is an aryl group. Namely, it is a compound including an arylsulfonium as a cation.

The arylsulfonium compound may be one in which all of $R_{201}$ to $R_{203}$ are aryl, or may be one in which part of $R_{201}$ to $R_{203}$ is aryl and the remainder is alkyl.

Examples of the arylsulfonium compound include triarylsulfonium compounds, diarylalkylsulfonium compounds, and aryldialkylsulfonium compounds.

The aryl group(s) of the arylsulfonium compound preferably are phenyl or naphthyl, and more preferably are phenyl. In the case where the arylsulfonium compound has two or more aryl groups, these aryl groups may be the same or different.

The alkyl groups which may be optionally possessed by the arylsulfonium compound preferably are linear, branched, or cyclic alkyl groups having 1 to 15 carbon atoms. Examples thereof include methyl, ethyl, propyl, n-butyl, sec-butyl, t-butyl, cyclopropyl, cyclobutyl, and cyclohexyl.

The aryl and alkyl groups represented by $R_{201}$ to $R_{203}$ may have one or more substituents selected from alkyl groups (e.g., ones having 1 to 15 carbon atoms), aryl groups (e.g., ones having 6 to 14 carbon atoms), alkoxy groups (e.g., ones having 1 to 15 carbon atoms), halogen atoms, hydroxy, and phenylthio. Preferred substituents are linear, branched, or cyclic alkyl groups having 1 to 12 carbon atoms and linear, branched, or cyclic alkoxy groups having 1 to 12 carbon atoms. Most preferred are alkyl groups having 1 to 4 carbon atoms and alkoxy groups having 1 to 4 carbon atoms. Any one of $R_{201}$ to $R_{203}$ may have one or more of such substituents, or each of these three groups may have one or more substituents. In the case where $R_{201}$ to $R_{203}$ are aryl groups, it is preferred that a substituent be bonded to the p-position in each aryl group.

Compound (ZI-2) will be explained next.

Compound (ZI-2) is a compound represented by formula (ZI) wherein $R_{201}$ to $R_{203}$ each independently represent an organic group containing no aromatic ring. The term "aromatic ring" as used here means a conception which includes an aromatic ring containing one or more heteroatoms.

The organic groups containing no aromatic ring which are represented by $R_{201}$ to $R_{203}$ each have generally 1 to 30, preferably 1 to 20 carbon atoms.

Preferably, $R_{201}$ to $R_{203}$ each independently represent an alkyl, 2-oxoalkyl, alkoxycarbonylmethyl, allyl, or vinyl group. More preferably, $R_{201}$ to $R_{203}$ each independently represent a linear, branched, or cyclic 2-oxoalkyl or alkoxycarbonylmethyl group. Most preferably, $R_{201}$ to $R_{203}$ each independently represent a linear or branched 2-oxoalkyl group.

The alkyl groups represented by $R_{201}$ to $R_{203}$ maybe linear, branched, or cyclic. Preferred examples thereof include linear or branched alkyl groups having 1 to 10 carbon atoms (e.g., methyl, ethyl, propyl, butyl, and pentyl) and cycloalkyl groups having 3 to 10 carbon atoms (e.g., cyclopentyl, cyclohexyl, and norbornyl).

The 2-oxoalkyl groups represented by $R_{201}$ to $R_{203}$ may be linear, branched, or cyclic. Preferred examples thereof include the alkyl groups shown above which each has >C=O in the 2-position.

Preferred examples of the alkoxy groups in the alkoxycarbonylmethyl groups represented by $R_{201}$ to $R_{203}$ include alkoxy groups having 1 to 5 carbon atoms (methoxy, ethoxy, propoxy, butoxy, and pentyloxy).

$R_{201}$ to $R_{203}$ each may have been further substituted with one or more substituents selected from halogen atoms, alkoxy groups (e.g., ones having 1 to 5 carbon atoms), hydroxy, cyano, and nitro.

Two of $R_{201}$ to $R_{203}$ may be bonded to each other to form a ring structure, and the ring may contain an oxygen atom, sulfur atom, ester bond, amide bond, or carbonyl group. Examples of the group formed by the bonding of two of $R_{201}$ to $R_{203}$ include alkylene groups (e.g., butylene and pentylene).

Compound (ZI-3) is a compound represented by the following general formula (ZI-3). This is a compound having a phenacylsulfonium salt structure.

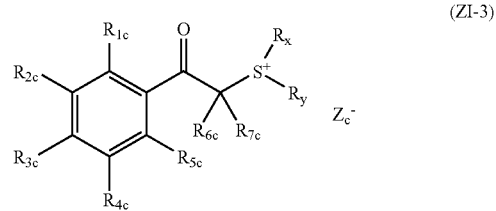

(ZI-3)

$R_{1c}$ to $R_{5c}$ each independently represent a hydrogen atom, alkyl group, alkoxy group, or halogen atom.

$R_{6c}$ and $R_{7c}$ each represent a hydrogen atom or an alkyl group, provided that $R_{6c}$ and $R_{7c}$ may be bonded to each other to form a ring.

$R_x$ and $R_y$ each independently represent an alkyl group, 2-oxoalkyl group, alkoxycarbonylmethyl group, allyl group, or vinyl group.

Two or more of $R_{1c}$ to $R_{5c}$ may be bonded to each other to form a ring structure, and $R_x$ and $R_y$ may be bonded to each other to form a ring structure. These ring structures each may contain an oxygen atom, sulfur atom, ester bond, or amide bond.

$Z_c^-$ represents a non-nucleophilic anion. Examples thereof include the same non-nucleophilic anions enumerated above as examples of $X^-$ in general formula (A).

The alkyl groups and alkoxy groups represented by $R_{1c}$ to $R_{5c}$ may be linear, branched, or cyclic.

It is preferred that at least one of $R_{1c}$ to $R_{5c}$ should be a linear, branched, or cyclic alkyl group or a linear, branched, or cyclic alkoxy group. More preferably, the total number of carbon atoms in $R_{1c}$ to $R_{5c}$ is from 2 to 15. This acid generator has further improved solubility in solvents, and use thereof is effective in inhibiting particle generation during storage.

The alkyl groups represented by $R_{1c}$ to $R_{5c}$ preferably are methyl, ethyl, propyl, isopropyl, butyl, t-butyl, pentyl, cyclopentyl, hexyl, and cyclohexyl.

Examples of the alkyl groups represented by $R_x$ and $R_y$ include the same alkyl groups as those enumerated above as examples of $R_{1c}$ to $R_{5c}$.

Examples of the 2-oxoalkyl group include the alkyl groups as $R_{1c}$ to $R_{5c}$ which each has >C=O in the 2-position.

Examples of the alkoxy group in the alkoxycarbonylmethyl group include the same alkoxy groups as those enumerated above as examples of $R_{1c}$ to $R_{5c}$.

Examples of the group formed by the bonding of $R_x$ and $R_y$ include butylene and pentylene.

In general formulae (ZII) and (ZIII), $R_{204}$ to $R_{207}$ each independently represent an aryl group which may have one or more substituents or an alkyl group which may have one or more substituents.

The aryl groups represented by $R_{204}$ to $R_{207}$ preferably are phenyl or naphthyl, and more preferably are phenyl.

The alkyl groups represented by $R_{204}$ to $R_{207}$ may be linear, branched, or cyclic. Preferred examples thereof include linear or branched alkyl groups having 1 to 10 carbon atoms (e.g., methyl, ethyl, propyl, butyl, and pentyl) and cycloalkyl groups having 3 to 10 carbon atoms (e.g., cyclopentyl, cyclohexyl, and norbornyl).

Examples of the substituents which may be possessed by $R_{204}$ to $R_{207}$ include alkyl groups (e.g., ones having 1 to 15 carbon atoms), aryl groups (e.g., ones having 6 to 15 carbon atoms), alkoxy groups (e.g., ones having 1 to 15 carbon atoms), halogen atoms, hydroxy, and phenylthio.

$X^-$ represents a non-nucleophilic anion. Examples thereof include the same non-nucleophilic anions enumerated above as examples of $X^-$ in general formula (A).

Of the compounds decomposing upon irradiation with actinic rays to generate an acid which are optionally usable in the invention, examples of especially effective compounds include ones represented by the following formulae (ZIV) to (ZVII).

 (ZIV)

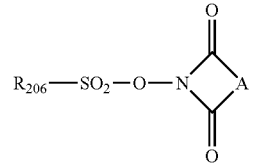 (ZV)

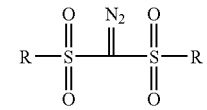 (ZVI)

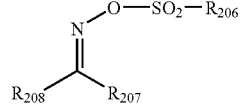 (ZVII)

In general formulae (ZIV) to (ZVII), $Ar^3$ and $Ar^4$ each independently represent a substituted or unsubstituted aryl group.

$R_{206}$ represents a substituted or unsubstituted alkyl or aryl group.

A represents a substituted or unsubstituted alkylene, alkenylene, or arylene group.

R represents a linear, branched, or cyclic alkyl group or an optionally substituted aryl group.

$R_{207}$ represents an electron-attracting group, preferably a cyano or fluoroalkyl group.

$R_{208}$ represents an optionally substituted alkyl or aryl group.

Especially preferred examples of the optionally usable compounds which decompose upon irradiation with actinic rays or a radiation to generate an acid are shown below.

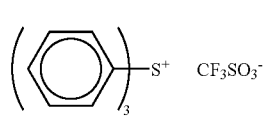 (z1)

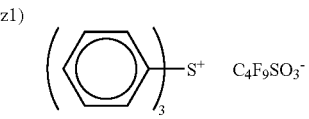 (z2)

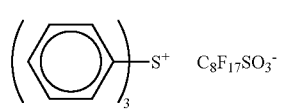 (z3)

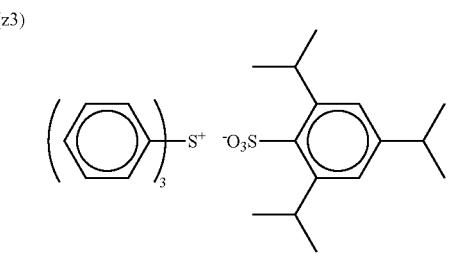 (z4)

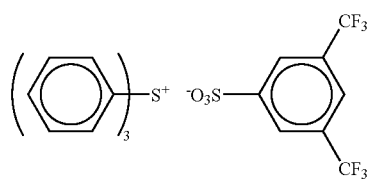 (z5)

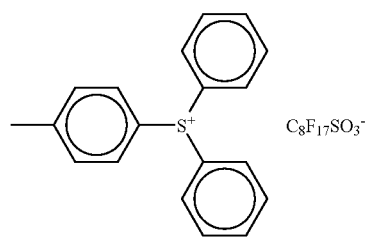 (z6)

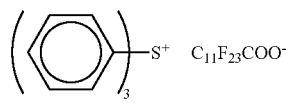
(z7)
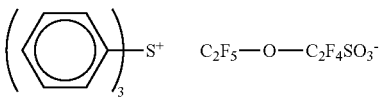
(z8)
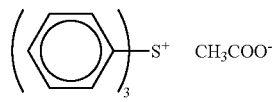
(z9)
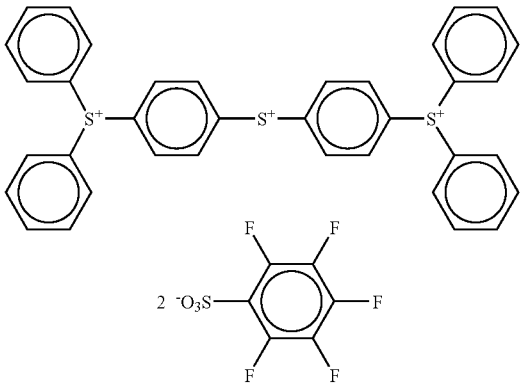
(z10)
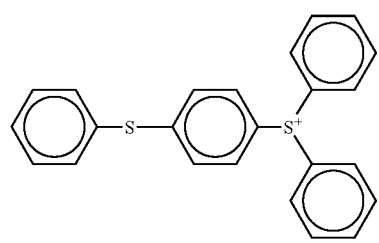
(z11)
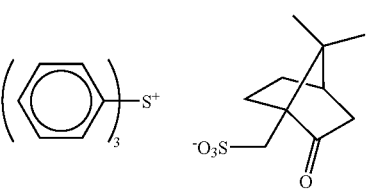
(z12)
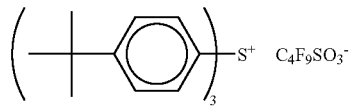
(z13)
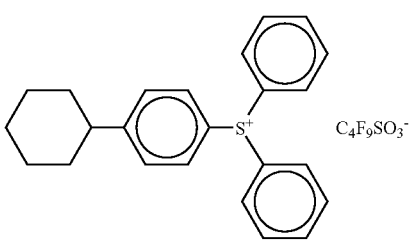
(z14)
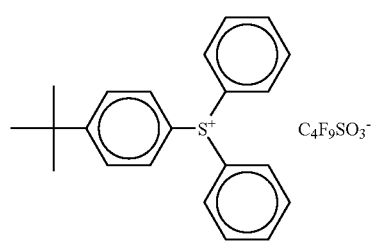
(z15)
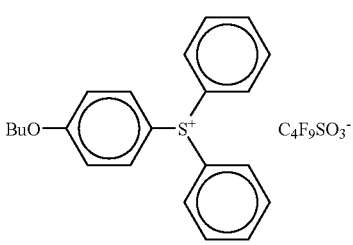
(z16)
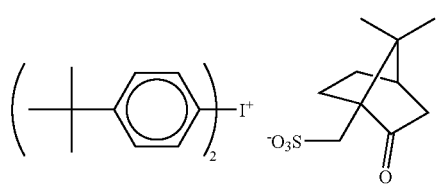
(Z17)
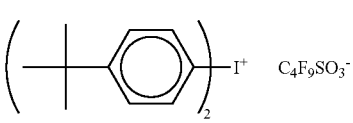
(z18)
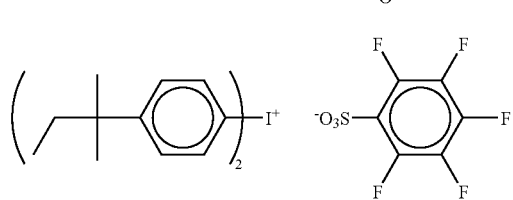
(z19)
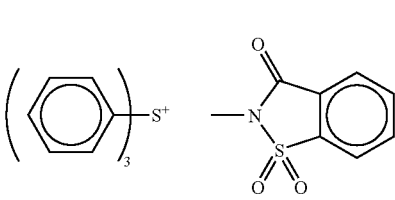
(z20)

-continued
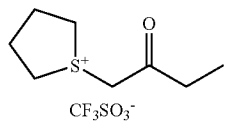 (z21)
CF₃SO₃⁻
 (z22)
C₄F₉SO₃⁻
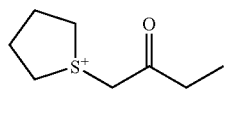 (z23)
C₈F₁₇SO₃⁻
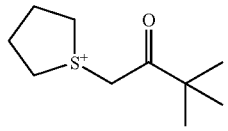 (z24)
CF₃SO₃⁻
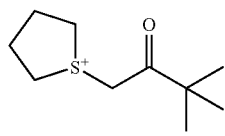 (z25)
C₄F₉SO₃⁻
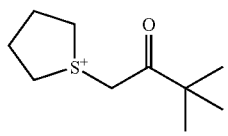 (z26)
C₈F₁₇SO₃⁻
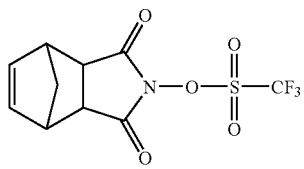 (z27)
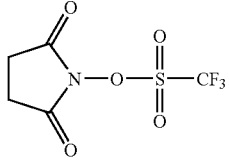 (z28)
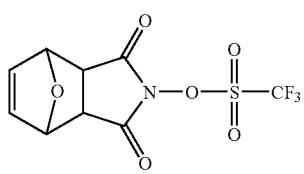 (z29)
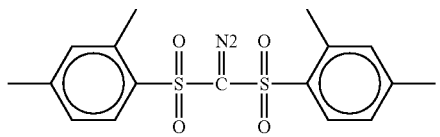 (z30)
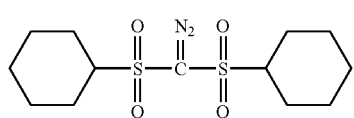 (z31)
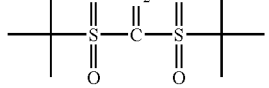 (z32)
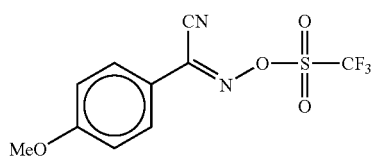 (z33)
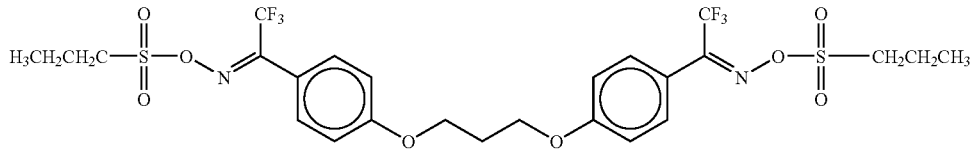 (z34)
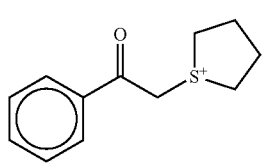 (z35)
CF₃SO₃⁻
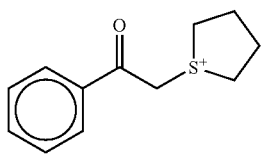 (z36)
C₄F₉SO₃⁻

-continued
(z37) 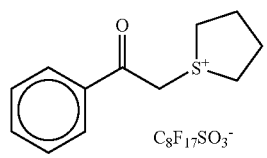
(z38) 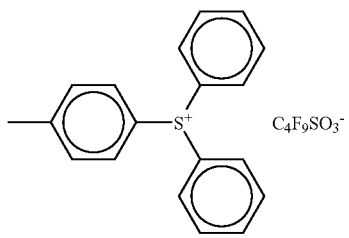
(z39) 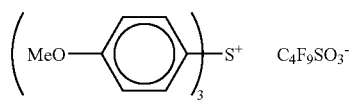
(z40) 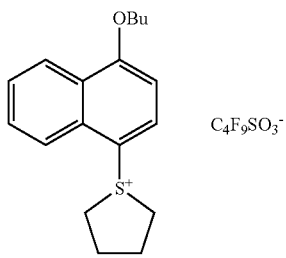
(z41) 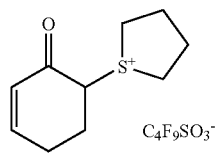
(z42) 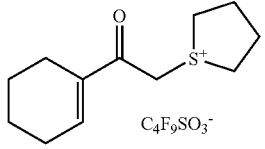
(z43) 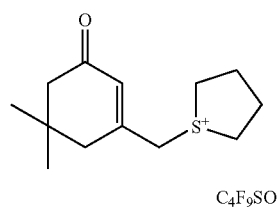
(z44) 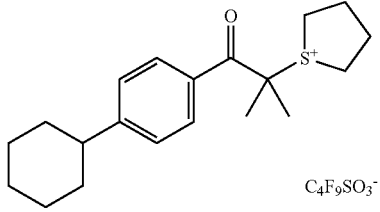
(z45) 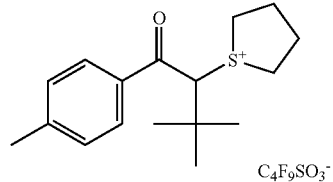
(z46) 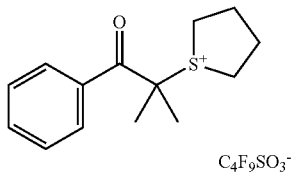
(z47) 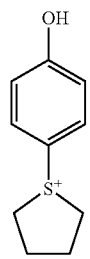
(z48) 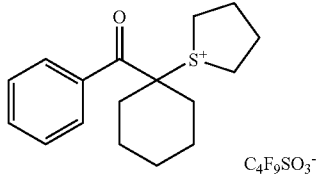
(z49) 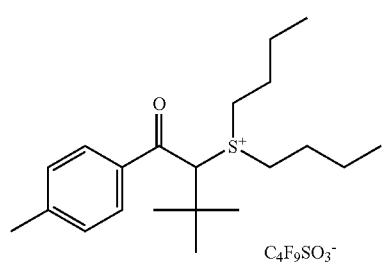
(z50) 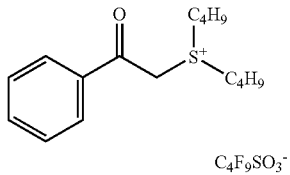

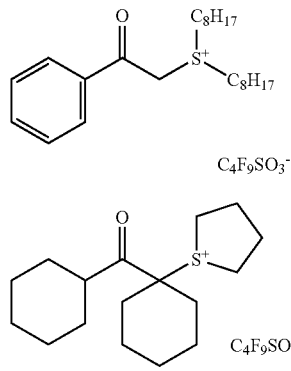
(z51)

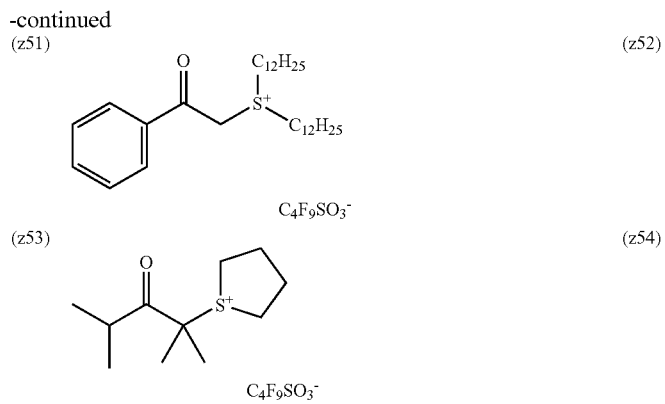
(z52) (z53) (z54)

The compounds which generate an acid upon irradiation with actinic rays may be added in an amount of from 0.1 to 20% by weight, preferably from 0.5 to 10% by weight, even more preferably from 1 to 7% by weight, based on all solid components of the composition of the invention. These compounds may be used alone or as a mixture of two or more thereof.

[3] (C) Fluorochemical Surfactant and/or Silicone Surfactant

The positive resist composition of the invention preferably further contains (C) any one of or two or more of fluorochemical and/or silicone surfactants (fluorochemical surfactants, silicone surfactants, and surfactants containing both fluorine atoms and silicon atoms).

When the positive resist composition of the invention contains the surfactant (C), it can show satisfactory sensitivity and resolution when irradiated with an exposure light having a wavelength of 250 nm or shorter, especially 220 nm or shorter, and give a resist pattern having satisfactory adhesion and reduced in development defects.

Examples of those surfactants (C) include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511, and 5,824,451. It is also possible to use the following commercial surfactants as they are.

Examples of usable commercial surfactants include fluorochemical or silicone surfactants such as F-Top EF301 and FE303 (manufactured by New Akita Chemical Company), Fluorad FC430 and 431 (manufactured by Sumitomo 3M Ltd.), Megafac F171, F173, F176, F189, and R08 (manufactured by Dainippon Ink & Chemicals, Inc.), Surflon S-382 and SC101, 102, 103, 104, 105, and 106 (manufactured by Asahi Glass Co., Ltd.), and Troysol S-366 (manufactured by Troy Chemical Co., Ltd.). Polysiloxane polymer KP-341 (manufactured by Shin-Etsu Chemical Co., Ltd.) can also be used as a silicone surfactant.

Also usable besides the known surfactants shown above is a surfactant comprising a polymer having a fluoroaliphatic group and derived from a fluoroaliphatic compound produced by the telomerization method (also called telomer method) or oligomerization method (also called oligomer method). The fluoroaliphatic compound can be synthesized by the method described in JP-A-2002-90991.

The polymer having a fluoroaliphatic group preferably is a copolymer of a monomer having a fluoroaliphatic group with a poly(oxyalkylene) acrylate and/or a poly(oxyalkylene) methacrylate. This copolymer may be one in which the monomer units are randomly distributed or be a block copolymer. Examples of the poly(oxyalkylene) group include poly(oxyethylene), poly(oxypropylene), and poly(oxybutylene). The poly(oxyalkylene) group may be a unit having, in the same chain, alkylenes having different chain lengths, such as a poly(blocks of oxyethylene, oxypropylene, and oxyethylene) or poly(blocks of oxyethylene and oxypropylene) group. The copolymer of a monomer having a fluoroaliphatic group with a poly(oxyalkylene) acrylate (or methacrylate) is not limited to binary copolymers, and may be a copolymer of three or more monomers which is obtained by copolymerization in which two or more different monomers each having a fluoroaliphatic group, two or more different poly(oxyalkylene) acrylates (or methacrylates), etc. are simultaneously copolymerized.

Examples of commercial surfactants include Megafac F178, F-470, F-473, F-475, F-476, and F-472 (manufactured by Dainippon Ink & Chemicals, Inc.). Examples of the polymer having a fluoroaliphatic group further include a copolymer of an acrylater (or methacrylate) having a $C_6F_{13}$ group with a poly(oxyalkylene) acrylate (or methacrylate), a copolymer of an acrylate (or methacrylate) having a $C_6F_{13}$ group with poly(oxyethylene) acrylate (or methacrylate) and poly(oxypropylene) acrylate (or methacrylate), a copolymer of an acrylate (or methacrylate) having a $C_8F_{17}$ group with a poly(oxyalkylene) acrylate (or methacrylate), and a copolymer of an acrylate (or methacrylate) having a $C_8F_{17}$ group with poly(oxyethylene) acrylate (or methacrylate) and poly(oxypropylene) acrylate (or methacrylate).

The amount of the surfactant (C) to be used is preferably from 0.0001 to 2% by weight, more preferably from 0.001 to 1% by weight, based on the total amount of the positive resist composition (excluding the solvent).

[4] (D) Basic Compound

The composition of the invention preferably contains (D) a basic compound so as to inhibit the resist from changing in performance with the lapse of time from exposure to heating.

Preferred examples of the structure of the basic compound include structures represented by the following formulae (A) to (E).

(A)

In formula (A), $R^{250}$, $R^{251}$, and $R^{252}$ each independently are a hydrogen atom, an alkyl group having 1 to 20 carbon atoms, an aminoalkyl group having 1 to 20 carbon atoms, a hydroxyalkyl group having 1 to 20 carbon atoms, or a substituted or unsubstituted aryl group having 6 to 20 carbon atoms, provided that $R^{250}$ and $R^{251}$ may be bonded to each other to form a ring.

Those alkyl chains may contain an oxygen atom, sulfur atom, or nitrogen atom.

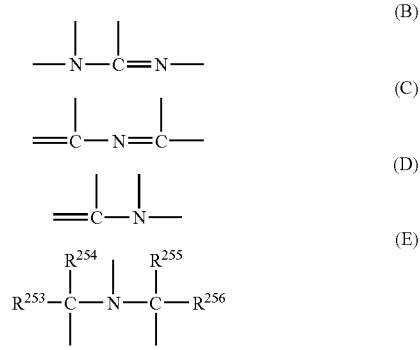

(In formula (E), $R^{253}$, $R^{254}$, $R^{255}$, and $R^{256}$ each independently represent an alkyl group having 1 to 6 carbon atoms.)

Preferred examples of the basic compound include substituted or unsubstituted guanidine, substituted or unsubstituted aminopyrrolidine, substituted or unsubstituted pyrazole, substituted or unsubstituted pyrazoline, substituted or unsubstituted piperazine, substituted or unsubstituted aminomorpholine, substituted or unsubstituted aminoalkylmorpholines, and substituted or unsubstituted piperidine. More preferred examples thereof include compounds having an imidazole structure, diazabicyclo structure, onium hydroxide structure, onium carboxylate structure, trialkylamine structure, aniline structure, or pyridine structure, alkylamine derivatives having a hydroxy group and/or an ether bond, and aniline derivatives having a hydroxy group and/or an ether bond.

Examples of the compounds having an imidazole structure include imidazole, 2,4,5-triphenylimidazole, and benzimidazole. Examples of the compounds having a diazabicyclo structure include 1,4-diazabicyclo[2.2.2]octane, 1,5-diazabicyclo[4.3.0]non-5-ene, and 1,8-diazabicyclo[5.4.0]undec-7-ene. Examples of the compounds having an onium hydroxide structure include triarylsulfonium hydroxides, phenacylsulfonium hydroxide, and sulfonium hydroxides having a 2-oxoalkyl group, and specific examples thereof include triphenylsulfonium hydroxide, tris(t-butylphenyl)sulfonium hydroxide, bis(t-butylphenyl)iodonium hydroxide, phenacylthiophenium hydroxide, and 2-oxopropylthiophenium hydroxide. The compounds having an onium carboxylate structure are the same as the compounds having an onium hydroxide structure, except that the anion moiety has been changed to carboxylate. Examples thereof include acetates, adamantane-1-carboxylates, and perfluoroalkyl carboxylates. Examples of the compounds having a trialkylamine structure include tri-n-butylamine and tri-n-octylamine. Examples of the aniline compounds include 2,6-diisopropylaniline and N,N-dimethylaniline. Examples of the alkylamine derivatives having a hydroxy group and/or ether bond include ethanolamine, diethanolamine, triethanolamine, and tris(methoxyethoxyethyl)amine. Examples of the aniline derivatives having a hydroxy group and/or ether bond include N,N-bis(hydroxyethyl)aniline.

Those basic compounds may be used alone or in combination of two or more thereof. The amount of the basic compound to be used is generally from 0.001 to 10% by weight, preferably from 0.01 to 5% by weight, based on the solid components of the resist composition.

In case where the amount of the basic compound added is less than 0.001% by weight, the addition thereof produces no effect. On the other hand, amounts thereof exceeding 10% by weight tend to result in reduced sensitivity and impaired developability of unexposed areas.

[5] Other Ingredients for Use in the Composition of the Invention (E) Solvent

The resist composition of the invention is used after the ingredients described above are dissolved in a given organic solvent.

Examples of usable organic solvents include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran.

In the invention, such organic solvents may be used alone or as a mixture of two or more thereof. However, it is preferred to use a mixed solvent prepared by mixing at least one solvent containing one or more hydroxy groups in the structure with at least one solvent containing no hydroxy group. Use of this mixed solvent is effective in diminishing particle generation during resist fluid storage.

Examples of the solvent containing one or more hydroxy groups include ethylene glycol, ethylene glycol monomethyl ether, ethylene glycol monoethyl ether, propylene glycol, propylene glycol monomethyl ether, propylene glycol monoethyl ether, and ethyl lactate. Especially preferred of these are propylene glycol monomethyl ether and ethyl lactate.

Examples of the solvent containing no hydroxy group include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide. Especially preferred of these are propylene glycol monomethyl ether acetate, ethyl ethoxypropionate, 2-heptanone, γ-butyrolactone, cyclohexanone, and butyl acetate. Most preferred of these are propylene glycol monomethyl ether acetate, ethyl ethoxypropionate, and 2-heptanone.

The proportion (by weight) of the solvent containing one or more hydroxy groups to the solvent containing no hydroxy group is from 1/99 to 99/1, preferably from 10/90 to 90/10, more preferably from 20/80 to 60/40. A mixed solvent containing at least 50% by weight solvent containing no hydroxy group is especially preferred from the standpoint of evenness of application.

(F) Acid-Decomposable Dissolution Inhibitive Compound

The positive resist composition of the invention preferably contains (F) a dissolution inhibitive low-molecular compound which has a group dissociating by the action of an acid to enhance solubility in an alkali developer and has a molecular weight of 3,000 or lower (hereinafter referred to also as "acid-decomposable dissolution inhibitive compound (F)").

Especially preferred are a compound having one or more fluorine atoms in the molecule and a compound which further has a group comprising a carboxyl or hydroxy group in which the hydrogen atom has been replaced by an acid-decomposable group.

The molecular weight of the acid-decomposable dissolution inhibitive compound according to the invention is 3,000 or lower, preferably from 300 to 3,000, more preferably from 500 to 2,500.

The amount of the acid-decomposable dissolution inhibitive compound (F) to be added is preferably from 3 to 50% by weight, more preferably from 5 to 40% by weight, based on all solid components of the positive resist composition.

In the production of precision integrated-circuit elements or in similar processes, the step of resist pattern formation on a substrate can be conducted in the following manner. The positive resist composition of the invention is applied to a substrate (e.g., a silicon substrate coated with silicon dioxide or a transparent substrate such as a glass substrate or ITO substrate). The resultant coating is irradiated with actinic rays or a radiation using a drawing apparatus and then subjected to heating, development, rinsing, and drying. Thus, a satisfactory resist pattern can be formed.

As an alkali developer for the positive resist composition of the invention can be used an aqueous solution of an alkali such as an inorganic alkali, e.g., sodium hydroxide, potassium hydroxide, sodium carbonate, sodium silicate, sodium metasilicate, or ammonia water, a primary amine, e.g., ethylamine or n-propylamine, a secondary amine, e.g., diethylamine or di-n-butylamine, a tertiary amine, e.g., triethylamine or methyldiethylamine, an alcoholamine, e.g., dimethylethanolamine or triethanolamine, a quaternary ammonium salt, e.g., tetramethylammonium hydroxide, tetraethylammonium hydroxide, or choline, or a cyclic amine, e.g., pyrrole or piperidine. It is also possible to use a developing solution prepared by adding an appropriate amount of an alcohol, e.g., isopropyl alcohol, or a surfactant, e.g., a nonionic one, to an aqueous solution of any of those alkalis.

Preferred of those developing solutions are aqueous solutions of quaternary ammonium salts. More preferred is an aqueous solution of tetramethylammonium hydroxide or choline.

The alkali concentration of the alkali developer is generally from 0.1 to 20% by weight.

The pH of the alkali developer is generally from 10.0 to 15.0.

EXAMPLES

The invention will be explained below in greater detail by reference to Examples, but the contents of the invention should not be construed as being limited to the following Examples.

Synthesis Example

Synthesis of Compound I-1

In 250 g of methanesulfonic acid was dissolved 25 g of diphosphorus pentoxide. Thereto were added 100 g of diphenyl sulfoxide and 66.5 g of 2,6-xylenol. This reaction mixture was reacted at 50° C. for 3 hours and then poured onto ice. The resultant aqueous solution was washed twice with ethyl acetate. To the aqueous phase was added an aqueous solution of 250 g of ammonium iodide. As a result, particles precipitated. These particles were taken out by filtration and washed with water and ethyl acetate to obtain 123 g of 4-hydroxy-3,5-dimethylphenyldiphenylsulfonium iodide.

In 500 mL of methanol was dissolved 20 g of 4-hydroxy-3,5-dimethylphenyldiphenylsulfonium iodide. Thereto was added 11.9 g of silver(I) oxide. This reaction mixture was stirred at room temperature for 4 hours and then filtered through a 0.1-μm filter. Thereto were added 16.3 g of potassium nonafluorobutanesulfonate and 15 mL of concentrated hydrochloric acid. This solution was concentrated and the crude reaction product obtained was dissolved in 500 mL of ethyl acetate. This solution was washed with distilled water three times, and the ethyl acetate phase was concentrated. As a result, 4-hydroxy-3,5-dimethylphenyldiphenylsulfonium nonafluorobutanesulfonate (compound I-1) was obtained in an amount of 23 g. Other compounds were synthesized in the same manner.

The following resins were used in the Examples according to the invention.

Weight-average molecular weight (dispersity ratio)

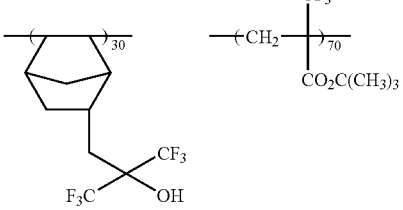

(F-1)      15200 (1.45)

-continued
| | Weight-average molecular weight (dispersity ratio) |
|---|---|
| (F-2) 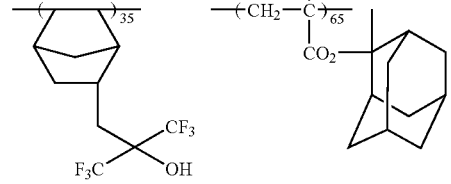 | 24000 (1.75) |
| (F-3) 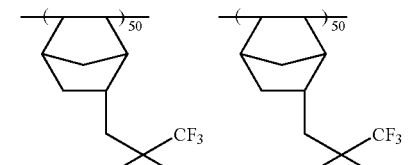 | 18200 (1.85) |
| (F-5) 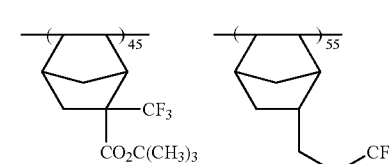 | 9500 (1.58) |
| (F-11) 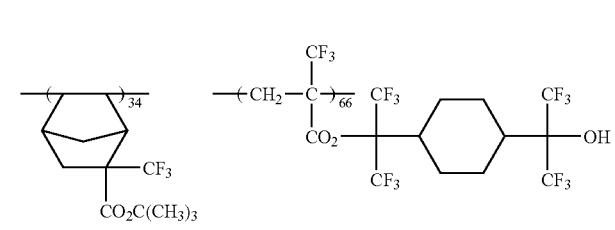 | 8700 (1.95) |
| (F-12) 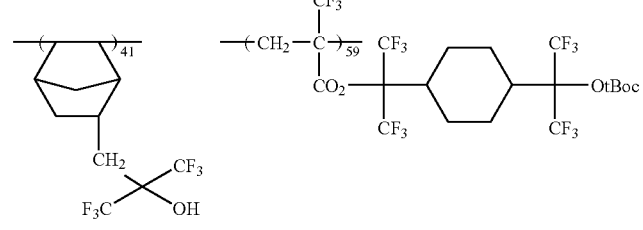 | 19500 (1.65) |
| (F-15) 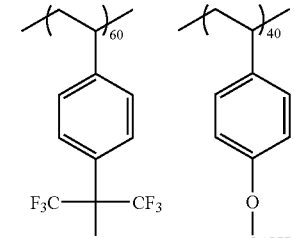 | 15000 (1.55) |

-continued

| | Weight-average molecular weight (dispersity ratio) |
|---|---|
| (F-18) | 16000 (1.54) |
| (F-19) | 14600 (1.95) |
| (F-21) | 7600 (1.52) |
| (F-25) | 9200 (1.71) |
| (F-29) | 7400 (1.59) |
| (F-32) | 4700 (1.51) |
| (F-35) | 4600 (1.68) |

-continued
| | Weight-average molecular weight (dispersity ratio) |
|---|---|
| (F-36) 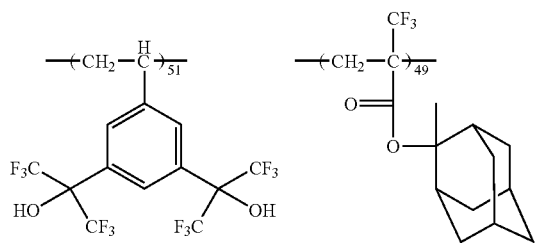 | 10200 (1.35) |
| (F-37) 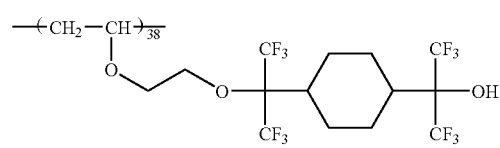 | 9200 1.71 |
| 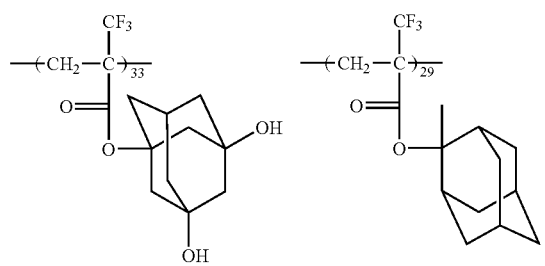 | 8300 (1.55) |
| (F-38) 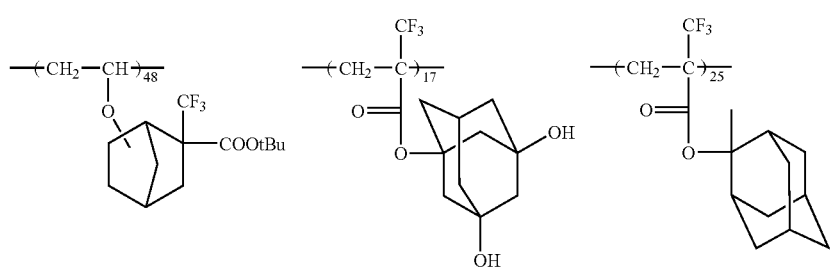 | 8000 (1.52) |
| (F-39) 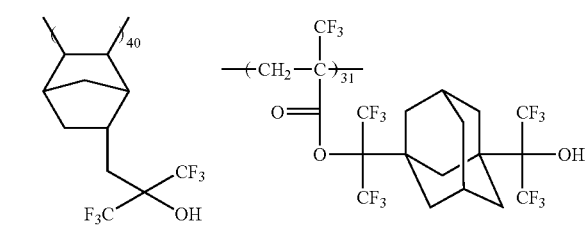 | 9200 (1.71) |
| 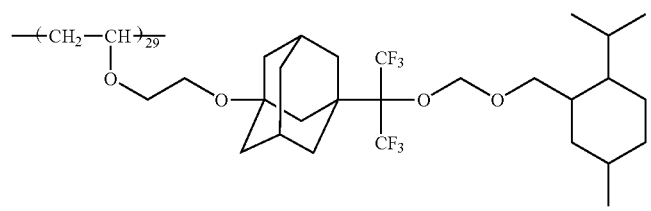 | |

Examples 1 to 19 and Comparative Example 1.

<Resist Preparation>

The ingredients shown in Table 1 were dissolved in a solvent to prepare a solution having a solid concentration of 12% by weight. This solution was filtered through a 0.1-μm polytetrafluoroethylene filter or polyethylene filter to prepare a positive resist solution. The positive resist solutions thus prepared were evaluated by the following methods.

W-1: Megafac F176 (manufactured by Dainippon Ink & Chemicals, Inc.) (fluorochemical)
W-2: Megafac R08 (manufactured by Dainippon Ink & Chemicals, Inc.) (fluorochemical and silicone)
W-3: polysiloxane polymer KP-341 (manufactured by Shin-Etsu Chemical Co., Ltd.) (silicone)
W-4: Troysol S-366 (manufactured by Troy Chemical Co., Ltd.)

TABLE 1

| | Ingredient (A) Resin 10 g | Ingredient (B) Acid generator (g) | Acid generator used in combination (g) | Basic compound (g) | Surfactant 0.003 g | Solvent |
|---|---|---|---|---|---|---|
| Ex. 1 | (F-1) | I-1 (0.4) | | DIA (0.02) | W-1 | A1 = 100 |
| Ex. 2 | (F-2) | I-3 (0.3) | z1(0.1) | TPI (0.01) | W-1 | A1 = 100 |
| Ex. 3 | (F-3) | I-4 (0.3) | z25(0.1) | TOA (0.01) | W-2 | A1 = 100 |
| Ex. 4 | (F-5) | I-10 (0.35) | z36(0.3) | HEP (0.05) | W-2 | A3/B1 = 80/20 |
| Ex. 5 | (F-8) | I-16 (0.3) | z31(0.3) | DBN (0.02) | W-3 | A2/B1 = 90/10 |
| Ex. 6 | (F-11) | I-29 (0.5) | z42(0.1) | DCMA (0.03) | W-4 | A4/B1 = 90/10 |
| Ex. 7 | (F-12) | I-35 (0.4) | z40(0.1) | TPA (0.01) | W-4 | A1/B1 = 50/50 |
| Ex. 8 | (F-15) | I-52 (0.3) | z38(0.2) | TPSA (0.1) | W-4 | A1/B1 = 90/10 |
| Ex. 9 | (F-18) | I-11 (0.3) | z44(0.1) | TBAH (0.015) | W-4 | A5/B2 = 90/10 |
| Ex. 10 | (F-19) | I-9 (0.3) | z50(0.1) z38 (0.1) | TMEA (0.02) | W-4 | A1/B1 = 95/5 |
| Ex. 11 | (F-21) | I-53 (0.5) | z54(0.2) | HAP (0.01) | W-1 | A1/B1 = 60/40 |
| Ex. 12 | (F-25) | I-31 (0.2) | z47(0.2) | DBN (0.015) | W-2 | A1/A5 = 60/40 |
| Ex. 13 | (F-29) | I-26 (0.15) | z53(0.3) | DIA (0.005) | W-4 | A1/B1 = 60/40 |
| Ex. 14 | (F-32) | I-51 (0.2) | z28(0.1) | TPI (0.04) | W-3 | A1/A5 = 60/40 |
| Ex. 15 | (F-35) | I-1 (0.3) | z34(0.2) | TOA (0.01) | W-1 | A1 = 100 |
| Ex. 16 | (F-36) | I-8 (0.3) | z43(0.3) | HEP (0.05) | W-2 | A1/B1 = 60/40 |
| Ex. 17 | (F-37) | I-7 (0.2) | z1(0.2) | DBN (0.02) | W-4 | A1/A5 = 60/40 |
| Ex. 18 | (F-38) | I-13 (0.3) | z6(0.1) | DCMA (0.03) | W-4 | A1/A4 = 95/5 |
| Ex. 19 | (F-39) | I-34 (0.4) | z8(0.1) | DBN (0.05) | W-1 | A1/B1 = 70/30 |
| Comp. Ex. 1 | (F-1) | PAG-A (0.4) | | DIA (0.02) | W-1 | A1 = 100 |

PAG-A: triphenylsulfonium nonafluorobutanesulfonate

Abbreviations used in Table 1 have the following meanings
DBN: 1,5-diazabicyclo[4.3.0]non-5-ene
TPI: 2,4,5-triphenylimidazole
TPSA: triphenylsulfonium acetate
HEP: N-hydroxyethylpiperidine
DIA: 2,6-diisopropylaniline
DCMA: dicyclohexylmethylamine
TPA: tripentylamine
TOA: tri-n-octylamine
HAP: hydroxyantipyrine
TBAH: tetrabutylammonium hydroxide
TMEA: tris(methoxyethoxyethyl)amine
LCB: t-butyl lithocholate The abbreviations for solvents are as follows. In the case where solvents were used in combination, the proportion thereof is shown in terms of weight ratio.
A1: propylene glycol methyl ether acetate
A2: 2-heptanone
A3: ethyl ethoxypropionate
A4: γ-butyrolactone
A5: cyclohexanone
B1: propylene glycol methyl ether
B2: ethyl lactate <Resist Evaluation>

Sensitivity Evaluation:

Each positive resist solution was applied with a spin coater to a silicon wafer treated with hexamethyldisilazane.

The coating was dried by heating at 120° C. for 90 seconds using a vacuum contact type hot plate to obtain a resist film having a thickness of 0.15 μm.

The resist film obtained was exposed with 157-nm laser illuminator/dissolution behavior analyzer VUVES-4500 (manufactured by Litho Tech Japan Corporation). Immediately after the exposure, the resist film was heated at 120° C. for 90 seconds with a hot plate. This resist film was developed with a 2.38% by weight aqueous solution of tetramethylammonium hydroxide for 60 seconds and then rinsed with pure water to obtain a sample wafer. The sample wafers thus obtained were examined to determine the exposure energy necessary for the resolution of a large pattern (sensitivity).

Method of Development Defect Evaluation:

Each resist composition was evenly applied with a spin coater to a 6-inch silicon substrate treated with hexamethyldisilazane. The coating was dried by heating at 120° C. for 90 seconds on a hot plate to form a 0.15-μm resist film. Without being exposed, this resist film was heated at 120° C. for 90 seconds on a hot plate. This resist film was developed at 23° C. for 60 seconds with an aqueous tetramethylammonium hydroxide solution having a concentration of 2.38% by weight, subsequently rinsed with pure water for 30 seconds, and then dried. The sample wafers thus obtained were examined with KLA 2112 (manufactured by KLA-Tencor Japan Ltd.) to count the number of development defects (threshold, 12; pixel size=0.39).

The results obtained are shown in Table 2.

TABLE 2

|  | Sensitivity (mJ/cm$^2$) | Number of development defects |
|---|---|---|
| Example 1 | 8 | 56 |
| Example 2 | 5 | 42 |
| Example 3 | 6 | 53 |
| Example 4 | 5 | 65 |
| Example 5 | 7 | 60 |
| Example 6 | 4 | 38 |
| Example 7 | 8 | 47 |
| Example 8 | 8 | 75 |
| Example 9 | 9 | 52 |
| Example 10 | 5 | 71 |
| Example 11 | 6 | 36 |
| Example 12 | 7 | 44 |
| Example 13 | 10 | 33 |
| Example 14 | 8 | 49 |
| Example 15 | 4 | 57 |
| Example 16 | 5 | 36 |
| Example 17 | 7 | 63 |
| Example 18 | 9 | 55 |
| Example 19 | 9 | 69 |
| Comparative Example 1 | 8 | 4800 |

It is apparent from Table 2 that the positive resist compositions obtained in Examples 1 to 19 each show satisfactory sensitivity and are less apt to cause development defects even when the acid generator according to the invention was used in combination with a water-repellent fluororesin.

According to the invention, a positive resist composition can be provided which is sufficiently transparent to an exposure light having a wavelength of 157 nm, shows. satisfactory sensitivity, and is less apt to cause development defects.

The entire disclosure of each and every foreign patent application from which the benefit of foreign priority has been claimed in the present application is incorporated herein by reference, as if fully set forth.

What is claimed is:

1. A positive resist composition comprising:
   (A) a fluorine atom-containing resin,
   wherein the resin comprises at least one group that increases a solubility of the resin in an alkali developer by the action of an acid; and
   (B) a sulfonium salt compound represented by the following general formula (A) which generates an acid upon irradiation with one of an actinic ray and a radiation:

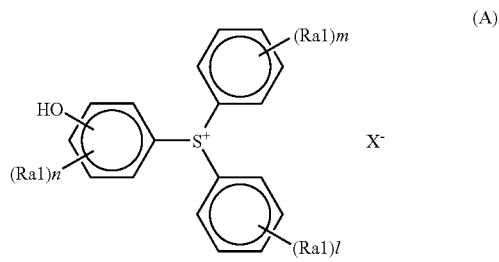

wherein $Ra_1$ represents a hydroxy group, a halogen atom, an alkyl group, an alkoxy group, an alkoxycarbonyl group, an aryl group, an aryloxy group, an acyl group, an acylamino group, or an alkylsulfonylamino group, provided that when two or more $Ra_1$'s are present in the molecule, these are the same or different; l, m, and n each represents an integer of 0 to 4; and $X^-$ represents a non-nucleophilic anion.

2. The positive resist composition of claim 1, wherein the resin (A) is a resin which has repeating a unit having a group represented by the following general formula (Z):

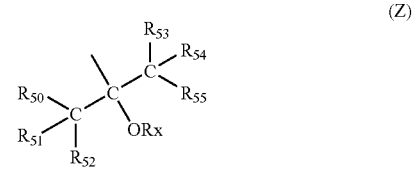

wherein $R_{50}$ to $R_{55}$ each independently represents a hydrogen atom, a fluorine atom, or an alkyl group, provided that at least one of $R_{50}$ to $R_{55}$ represents either a fluorine atom or an alkyl group in which at least one of the hydrogen atoms has been replaced by a fluorine atom; and Rx represents a hydrogen atom or an organic group.

3. The positive resist composition of claim 1, wherein the resin (A) includes a repeating unit and the repeating unit includes a group where a carboxyl group is protected by an acid-decomposable group.

4. The positive resist composition of claim 1, wherein the resin (A) has a weight-average molecular weight of from 1,000 to 200,000, and the resin (A) has no more than 10% by weight of a total amount of a component having a molecular weight of 1,000 or lower.

5. The positive resist composition of claim 1, further comprising:
   (C) a fluorochemical surfactant or silicone surfactant; and
   (D) a basic compound.

6. The positive resist composition of claim 5, wherein the basic compound (D) is a compound having a structure selected from an imidazole structure, diazabicyclo structure, onium hydroxide structure, onium carboxylate structure, trialkylamine structure, and aniline structure.

7. The positive resist composition of claim 1, further comprising (F) a dissolution-inhibiting compound having a molecular weight of not more than 3,000 which is capable of decomposing by the action of an acid to increase solubility in an alkali developer.

8. The positive resist composition of claim 1, wherein said at least one group, that increases a solubility of the resin in an alkali developer by the action of an acid, is a group causing an alkali-soluble group by the action of an acid.

9. A method of forming a resist pattern comprising:
coating the positive resist composition as described in claim 1 on a substrate;
irradiating a resultant coating with actinic rays or a radiation; and
developing the resultant coating.

10. The positive resist composition of claim 1, wherein at least one of the $Ra_1$ groups in formula (A) is not a hydrogen atom.

11. The positive resist composition of claim 1, wherein at least one of the $Ra_1$ groups on an aromatic ring group having a hydroxyl group in formula (A) is an alkyl group.

12. The positive resist composition of claim 1, wherein $X^-$ in formula (A) is selected from the group consisting of a nonafluorobutanesulfonic acid anion, a perfluorooctanesulfonic acid anion, a bis(alkylsulfonyl)imide anion, a tris(alkylsulfonyl)methyl anion, a benzenesulfonic acid anion substituted with one or more fluorine atoms, and a benzenesulfonic acid anion substituted with a group having one or more fluorine atoms.

* * * * *